United States Patent
Enomoto et al.

(10) Patent No.: US 9,663,671 B2
(45) Date of Patent: May 30, 2017

(54) CURABLE COMPOSITION FOR IMPRINTS AND METHOD OF STORING THE SAME

(71) Applicant: FUJIFILM Corporation, Minato-ku, Tokyo (JP)

(72) Inventors: Yuichiro Enomoto, Haibara-gun (JP); Kunihiko Kodama, Haibara-gun (JP); Shinji Tarutani, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 458 days.

(21) Appl. No.: 14/255,490

(22) Filed: Apr. 17, 2014

(65) Prior Publication Data

US 2014/0227493 A1   Aug. 14, 2014

Related U.S. Application Data

(63) Continuation of application No. PCT/JP2012/076891, filed on Oct. 18, 2012.

(30) Foreign Application Priority Data

Oct. 18, 2011 (JP) ................. 2011-228891

(51) Int. Cl.
| | |
|---|---|
| C09D 11/30 | (2014.01) |
| G03F 7/00 | (2006.01) |
| C08F 2/50 | (2006.01) |
| B82Y 10/00 | (2011.01) |
| B82Y 40/00 | (2011.01) |

(52) U.S. Cl.
CPC .............. *C09D 11/30* (2013.01); *B82Y 10/00* (2013.01); *B82Y 40/00* (2013.01); *C08F 2/50* (2013.01); *G03F 7/0002* (2013.01); *Y10T 428/24802* (2015.01)

(58) Field of Classification Search
CPC ...... G03F 7/0002; C08L 29/02; C08F 220/24; Y10T 428/24802

See application file for complete search history.

(56) References Cited

U.S. PATENT DOCUMENTS

| | | | |
|---|---|---|---|
| 5,169,965 | A | 12/1992 | Fujiwa et al. |
| 5,198,509 | A | 3/1993 | Fujiwa et al. |
| 5,259,926 | A | 11/1993 | Kuwabara et al. |
| 5,338,879 | A | 8/1994 | Fujiwa et al. |
| 5,378,736 | A | 1/1995 | Fujiwa et al. |
| 5,772,905 | A | 6/1998 | Chou |
| 5,956,216 | A | 9/1999 | Chou |
| 7,198,968 | B2 | 4/2007 | Chae et al. |
| 7,821,586 | B2 | 10/2010 | Kim |
| 2005/0142714 | A1 | 6/2005 | Chae et al. |
| 2005/0231669 | A1 | 10/2005 | Kim |
| 2007/0246441 | A1* | 10/2007 | Kim ............ B82Y 10/00 216/41 |
| 2011/0059302 | A1* | 3/2011 | Kodama ........ B82Y 10/00 428/195.1 |

FOREIGN PATENT DOCUMENTS

| | | |
|---|---|---|
| JP | 11-100378 A | 4/1999 |
| JP | 2926262 B2 | 7/1999 |
| JP | 2004-240241 A | 8/2004 |
| JP | 2005-197699 A | 7/2005 |
| JP | 2005-301289 A | 10/2005 |
| JP | 2005-351979 A | 12/2005 |
| JP | 2006-251662 A | 9/2006 |
| JP | 2008-019292 A | 1/2008 |
| JP | 2008-105414 A | 5/2008 |
| JP | 2009-73078 A | 4/2009 |
| JP | 2010-006870 A | 1/2010 |
| JP | 2010-239121 A | 10/2010 |
| JP | 2011-157482 A | 8/2011 |

OTHER PUBLICATIONS

Machine translation of detailed description of JP 2010-006870 acquired on Jul. 28, 2016.*
Office Action dated Feb. 19, 2016, from the Intellectual Property Office of Taiwan in counterpart Taiwanese Application No. 101137564.
Office Action dated Mar. 17, 2015 from the Japanese Patent Office in counterpart JP Application No. 2011-228891.
International Preliminary Report on Patentability issued May 1, 2014.
Stephen Y. Chou, et al., "Imprint of sub-25 nm vias and trenches in polymers", Appl. Phys. Lett., Nov. 20, 1995, pp. 3114-3116, vol. 67 No. 21.
M. Colburn, et al., "Step and Flash Imprint Lithography: A New Approach to High-Resolution Patterning", SPIE, Mar. 1999, pp. 379-389, vol. 3676.
"Jikken Kagaku Koza (The Course of Experimental Chemistry)", 20 Yukigosei (Organic Synthesis) II, 1992, pp. 213-224, 4th Edition, published by MaruzenCo. Ltd.
Chapter on "Oxiranes" from the chemistry of heterocyclic compounds—Small Ring Heterocycles, pp. 1-196 (submitted in two parts with this IDS), edited by Alfred Hasner, John Wiley & Sons, New York, 1985.
Secchaku Yoshimura, Technology on Adhesion & Sealing, 1985, pp. 32-39, vol. 29, No. 12, 32.
Secchaku Yoshimura, Technology on Adhesion & Sealing, 1986, pp. 42-47, vol. 30, No. 5, 42.
Secchaku Yoshimura, Technology on Adhesion & Sealing, 1986, pp. 42-47, vol. 30, No. 7, 42.
Stephen C. Lapin, "Vinyl Ether Functionalized Urethane Oligomers: An Alternative to Acrylate Based Systems", Polymers Paint Colour Journal, 1989, pp. 321-328, vol. 179 No. 4237.
International Search Report for PCT/JP2012/076891.
Written Opinion for PCT/JP2012/076891.

* cited by examiner

*Primary Examiner* — Gerard Higgins
(74) *Attorney, Agent, or Firm* — Sughrue Mion, PLLC

(57) ABSTRACT

Provide is a curable composition for imprints, capable of effectively suppressing chipping of the cured pattern. A curable composition for imprints comprising (A) curable compound and (B) photo-polymerization initiator, having a moisture content ratio, relative to the total weight of all components excluding solvent, of less than 0.8% by weight.

14 Claims, No Drawings

CURABLE COMPOSITION FOR IMPRINTS AND METHOD OF STORING THE SAME

The present application is a continuation of PCT/JP2012/076891 filed on Oct. 18, 2012 and claims priority under 35 U.S.C. §119 of Japanese Patent Application No. 228891/2011 filed on Oct. 18, 2011.

TECHNICAL FIELD

The present invention relates to a curable composition for imprints, a method of manufacturing the same, and a pattern-forming method using the curable composition for imprints. The present invention also relates to a method of storing the curable composition for imprints.

In particular, semiconductor integrated circuit, flat screen, micro electro-mechanical system (MEMS), sensor device, optical disk, magnetic recording media including high-density memory disk, optical components including grating and relief hologram, nanodevice, optical device, optical film and polarizing element used for manufacturing flat panel display, thin film transistor used for liquid crystal display, organic transistor, color filter, overcoat layer, pillar component, rib member for aligning liquid crystal, micro-lens array, immunoassay chip, DNA separation chip, microreactor, biological nanodevice, optical waveguide, optical filter, and photonic liquid crystal.

BACKGROUND ART

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, non-patent literature 1), and the other is a photonanoimprint method using a photocurable composition (for example, non-patent literature 2). In the thermal nanoimprint method, a mold is pressed against a polymer resin heated up to a temperature not lower than the glass transition temperature thereof, then the resin is cooled and thereafter released from the mold to thereby transfer the microstructure of the mold onto the resin on a substrate. The method has been expected to be applied in various fields, by virtue of its applicability to a wide variety of resin materials and glass materials. For example, Patent Literatures 1 and 2 discloses nanoimprinting processes capable of forming nanopatterns using thermoplastic resins at low costs.

On the other hand, according to photo-nanoimprinting process by which a nano-photocurable composition for imprints is illuminated by light through a translucent mold or a translucent substrate, so as to cure a nano-photocurable composition for imprints, it is no longer necessary to heat the material onto which a pattern is transferred when stamped under a mold, and this enables imprint at room temperature. In recent years, reports have been also issued regarding new trends of development including nanocasting process which combines advantages of the both, and reversal imprinting process capable of forming a three-dimensional stacked structure.

Applications listed below have been proposed for the imprinting.

A first application relates to that a geometry (pattern) per se obtained by molding is functionalized so as to be used as a nano-technology component, or a structural member. Examples of which include a variety of micro- or nano-optical component, high-density recording medium, optical film, and structural member of flat panel display.

A second application relates to building-up of a laminated structure by using a mold capable of simultaneously forming a micro-structure and a nano-structure, or by simple alignment between layers, and use of the laminated structure for manufacturing μ-TAS (Micro-Total Analysis System) or biochip.

A third application relates to use of the thus-formed pattern as a mask through which a substrate is worked typically by etching. By virtue of precise alignment and a large degree of integration, this technique can replace the conventional lithographic technique in manufacturing of high-density semiconductor integrated circuit, transistors in liquid crystal display device, and magnetic material for composing next-generation hard disk called patterned medium. Approaches for implementing the imprinting in these applications have been becoming more active in recent years.

As an exemplary application of the nanoimprinting process, first to be explained is an application to manufacture of high-density semiconductor integrated circuits. The semiconductor integrated circuits have been acceleratingly shrunk and integrated in these years, and for the purpose of implementing this sort of fine processing, photolithographic apparatuses used for pattern transfer have ceaselessly been improved in the preciseness. In order to address further requirements for shrinkage, it has however been becoming difficult to concurrently satisfy three requirements on resolution power of fine pattern, cost of apparatus, and throughput. In contrast, nanoimprint lithography (photo-nanoimprinting) has been proposed as a technique of forming fine patterns at low costs. For example, Patent Literature 1 and Patent Literature 3 listed below have disclosed nanoimprinting techniques using a silicon wafer as a stamper to form, by transfer, a fine structure of 25 nm or narrower. In this sort of application, a patternability as fine enough as several tens nanometers, and a high etching resistance enough to function as a mask during substrate working are required.

Paragraphs below will explain exemplary applications of the nanoimprinting to manufacturing of next-generation hard disc drive (HDD).

HDD has gone through a history of increase in capacity and down-sizing, supported by two major events, that is, advancements in performance of head and media. From the viewpoint of advancement in performance of media, the HDD has successfully increased its capacity through increase in surface recording density. Increase in the surface recording density, however, encounters an obstacle of so-called spread magnetic field from the side faces of the magnetic head. Since the spread magnetic field cannot be reduced beyond a certain level even if the head is shrunk, so that an event called "side light" will occur as a consequence. Once the side light should occur, also adjacent tracks would be written in the recording process, and thereby already-written data would be erased. Another possible event is that, due to the spread magnetic field, unnecessary signals would be read together from the adjacent tracks. There have, therefore, been proposed techniques called discrete track media and bit patterned media, which are directed to address these problems by filling a space between the tracks with a non-magnetic material so as to physically and magnetically isolate them. There have also been proposed use of nanoimprinting, as a method of forming a pattern of magnetic material or non-magnetic material in the manufacture of these media. Also in this application, required are pattern formability of several tens of nanometer level and high etching resistance enough to allow the pattern to serve as a mask.

Next, applications of the nanoimprinting process to flat displays such as liquid crystal display (LCD) and plasma display (PDP) will be explained.

With recent trends in dimensional expansion and higher definition of LCD substrate and PDP substrate, photo-nanoimprinting has recently attracted public attention as an inexpensive lithographic technique substitutive to the conventional photolithography having been used for manufacturing thin film transistor (TFT) and electrode sheet. The situation has raised a need for development of a photo-curable resist substitutive for etching photoresists having been used for the conventional photolithographic process.

There is also an ongoing trend in application of photo-nanoimprinting process to manufacture of structural members of LCD and so forth, such as translucent protective films described in Patent Literature 4 and Patent Literature 5, and a spacer described in Patent Literature 5. The resist for configuring these structural members is occasionally referred to as "permanent resist" or "permanent film", since it finally remains in the display.

Also a spacer, which determines a cell gap of liquid crystal display device, is a sort of permanent film. In the conventional photolithography, a photo-curable composition composed of a resin, photo-polymerizable monomer and an initiator has generally and widely been used (see Patent Literature 6, for example). The spacer is formed, generally by coating a photo-curable composition over a color filter substrate having a color filter formed thereon or a color filter protective film formed thereon, followed by patterning by photolithography to a size of 10 μm to 20 μm or around, and by post-baking for curing.

Also an antireflective structure composed of a micro-pattern with a 50 to 300 nm pitch is getting noticed. Nanoimprinting is also useful for forming such pattern. This sort of antireflective structure is represented by a micro dot pattern called "moth eye", which is effective to provide antireflection of surface of display, high-efficiency use of light by solar cell, and improved efficiency of extraction of light from LED and organic EL element. Since the thus formed patterns in these applications often remain in the final products, and are arranged in the outermost portions of articles, so that they are required to have good performances mainly in terms of durability and strength of film, including heat resistance, light resistance, solvent resistance, anti-scratching property, high mechanical performances under external pressure, and hardness.

The nanoimprinting lithography is also useful for applications regarding formation of permanent films, which include micro electro-mechanical system (MEMS), sensor device, optical components including grating and relief hologram, nanodevice, optical device, optical film and polarizing element used for manufacturing flat panel display, thin film transistor used for liquid crystal display device, organic transistor, color filter, overcoat layer, pillar component, rib member for aligning liquid crystal, micro-lens array, immunoassay chip, DNA separation chip, micro-reactor, biological nanodevice, optical waveguide, optical filter, and photonic liquid crystal.

In these applications regarding the permanent films, the thus-formed permanent films finally remain in the products, and are therefore required to be excellent mainly regarding durability and strength of the film, including heat resistance, light resistance, solvent resistance, scratch resistance, high mechanical performance under externally applied pressure, and hardness.

As described above, most of the patterns having been formed by the conventional photolithographic process may be formed by nanoimprinting, which has attracted public attention for its possibility of forming fine patterns at low costs, as known by Patent Literatures 7, for example.

CITATION LIST

Patent Literature

[Patent Literature 1] U.S. Pat. No. 5,772,905
[Patent Literature 2] U.S. Pat. No. 5,956,216
[Patent Literature 3] U.S. Pat. No. 5,259,926
[Patent Literature 4] JP-A-2005-197699
[Patent Literature 5] JP-A-2005-301289
[Patent Literature 6] JP-A-2004-240241
[Patent Literature 7] JP-A-2008-19292

Non-Patent Literature

[Non-Patent Literature 1] S. Chou et al., *Appl. Phys. Lett.*, Vol. 67, 3114 (1995)
[Non-Patent Literature 2] M. Colbun et al., *Proc. SPIE*, Vol. 3676, 379 (1999)

SUMMARY OF THE INVENTION

Technical Problem

Now the curable composition for imprints is required to show good pattern formability. Among various aspects of the pattern formability, it is important to suppress defects ascribable to chipping of the cured pattern.

It is therefore an object of the present invention to provide a curable composition for imprints and a method of storing the same, aimed at improving drawbacks in the prior art, and is to provide a curable composition for imprints capable of effectively suppressing chipping of the cured pattern.

Solution to Problem

The present inventors found out from our investigations directed to address the above-described problems, that moisture contained in the curable composition for imprints adversely affects the pattern chipping in the process of pattern-forming using the curable composition for imprints.

In a method of forming on a substrate a pattern using a photo-curable composition by imprinting, it is general to cure a curable composition by a radical polymerization reaction. The radical polymerization reaction is known to be insusceptible to moisture in the system, so that inclusion of moisture in the curable composition has been believed to be not critical. This is also suggested by the fact that there is a system which allows the radical polymerization reaction to proceed in water. It was, however, found in the present invention that the chipping of the cured pattern was distinctively suppressed by controlling the moisture content in the curable composition for imprints to a certain level or below.

While a detailed mechanism remains unclear, it is supposed to be as follows. When the curable composition for imprints is applied onto a substrate, the cured region shrinks in volume, and thereby moisture is expelled from the region. The moisture is condensed in the adjoining uncured region. If the condensed water grows to form a droplet, the uncured region no more allows therein the curing reaction to proceed as a consequence. This is supposedly because the curable compound is forced out by the droplet of the condensed moisture. As a consequence, pattern defects occur in the uncured region.

The method for solving the above-mentioned problem is as follows.

<1> A curable composition for imprint comprising (A) curable compound and (B) photo-polymerization initiator, having a moisture content ratio, relative to the total weight of all components excluding solvent, of less than 0.8% by weight.

<2> The curable composition for imprint of <1>, curable by a radical polymerization reaction.

<3> The curable composition for imprint of <1> or <2>, further comprising (C) polar group-containing non-polymerizable compound.

<4> The curable composition for imprint of <3>, wherein the polar group-containing non-polymerizable compound (C) is a hydroxy group-containing compound.

<5> The curable composition for imprint of <3>, wherein the polar group-containing non-polymerizable compound (C) is a hydroxy group-containing polymer.

<6> The curable composition for imprint any one of <1> to <5>, containing substantially no solvent.

<7> The curable composition for imprint any one of <1> to <6>, having a viscosity of 5 to 30 mPa·s.

<8> A method of manufacturing the curable composition for imprint described in any one of <1> to <7>, comprising mixing the ingredients under an environment at a temperature of 23° C. and a humidity of 30% or lower.

<9> A method of storing a curable composition for imprint, the method comprising enclosing the curable composition for imprint described in any one of <1> to <7> into a storage container, and storing the composition while adjusting a ratio of filling of the curable composition for imprint into the storage container to 30% by volume or more at the time of loading.

<10> The method of storing of <9>, comprising re-storing the curable composition for imprint, after being stored as described in <9> and used for pattern-forming, while adjusting a ratio of filling of the curable composition for imprint into the storage container to 30% by volume or more at the time of loading.

<11> The method of storing of <9> or <10>, wherein the curable composition for imprint is stored at 10° C. or lower.

<12> The method of storing of <11>, comprising re-storing the curable composition for imprint, after being stored as described in <11>, brought back to room temperature, and used for pattern-forming, while adjusting a ratio of filling of the curable composition for imprint into the storage container to 30% by volume or more at the time of loading.

<13> A pattern-forming method comprising:
applying the curable composition for imprint described in any one of <1> to <7> onto a base;
pressurizing a mold onto the curable composition for imprint; and
irradiating the light onto the curable composition for imprint.

<14> The pattern-forming method of <13>, wherein the curable composition for imprint is applied onto a base by an ink jet process.

<15> A pattern formed by the pattern-forming method described in <13> or <14>.

<16> An electronic device comprising the pattern described in <15>.

<17> A method of manufacturing an electronic device, the method comprising the pattern-forming method described in <13> or <14>.

Advantageous Effects of Invention

The present invention successfully provides a curable composition for imprint, capable of effectively suppressing chipping of the cured pattern.

DESCRIPTION OF EMBODIMENTS

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. The monomer in the context of the present invention is discriminated from oligomer and polymer, and is defined as any compound having a weight average molecular weight of 1,000 or smaller. In this specification, "functional group" refers to a group which participates in a polymerization reaction.

"Imprint" referred to in the invention is meant to indicate pattern transfer in a size of from 1 nm to 10 mm and preferably meant to indicate pattern transfer in a size of from about 10 nm to 100 µm (nanoimprint).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

The curable composition for imprint of the present invention characteristically contains (A) curable compound and (B) photo-polymerization initiator, and has a moisture content ratio, relative to the total weight of all components excluding solvent, of less than 0.8% by weight. The curable composition for imprint which contains (A) curable compound and (B) photo-polymerization initiator, when prepared or stored under an environment at room temperature, generally absorbs moisture from the air to increase the moisture content. While the moisture content is very small, and is not affective to the radical polymerization reaction in general, but is affective to the pattern formability.

The moisture content is preferably 0.6% by weight or less, and more preferably 0.4% by weight or less.

In the present invention, a moisture content of less than 0.8% by weight is achievable by a method of preparing the composition under a dry atmosphere, and then storing it in an appropriate manner.

The curable composition for imprint of the present invention contains (A) polymerizable monomer and (B) polymerization initiator. The (A) polymerizable monomer is exemplified by monomers having polymerizable group (s), oligomers having polymerizable group (s), polymers having polymerizable group (s), and mixtures of them. For example, commercially available polymerizable monomers generally contain not only monomers having a polymerizable group, but also trace amounts of oligomers and polymers produced by polymerization of the monomers. The polymerizable monomer in the context of the present invention encompasses all of them.

While species of the polymerizable monomer used for the curable composition for imprint of the present invention are not specifically limited so long as they do not depart from the spirit of the present invention, they are exemplified by polymerizable unsaturated monomer having one or more ethylenic unsaturated bond-containing groups; epoxy compound and oxetane compound; vinyl ether compound; styrene derivative; fluorine atom-containing compound; and propenyl ether or butenyl ether.

The polymerizable unsaturated monomer having one or more ethylenic unsaturated bond-containing groups will be explained.

To begin with, the polymerizable unsaturated monomer having one or more ethylenic unsaturated bond-containing groups is specifically exemplified by methyl(meth)acrylate, ethyl(meth)acrylate, butyl(meth)acrylate, N-vinylpyrrolidinone, 2-acryloyloxyethyl phthalate, 2-acryloyloxy-2-hydroxyethyl phthalate, 2-acryloyloxy ethylhexahydro phthalate, 2-acryloyloxypropyl phthalate, 2-ethyl-2-butylpropanediol acrylate, 2-ethylhexyl(meth)acrylate, 2-ethylhexylcarbitol(meth)acrylate, 2-hydroxybutyl(meth)acrylate, 2-hydroxyethyl(meth)acrylate, 2-hydroxypropyl (meth)acrylate, 4-hydroxybutyl(meth)acrylate, acrylic acid dimer, benzyl(meth)acrylate, 1- or 2-naphthyl(meth)acrylate, butoxyethyl(meth)acrylate, cetyl(meth)acrylate, ethylene oxide-modified (referred to as "EO", hereinafter) cresol (meth)acrylate, dipropylene glycol(meth)acrylate, ethoxylated phenyl(meth)acrylate, isooctyl(meth)acrylate, cyclohexyl(meth)acrylate, isobornyl(meth)acrylate, dicyclopentanyl(meth)acrylate, dicyclopentanyloxyethyl(meth) acrylate, isomyristyl(meth)acrylate, lauryl(meth)acrylate, methoxydipropylene glycol(meth)acrylate, methoxytripropylene glycol(meth)acrylate, methoxypolyethylene glycol (meth)acrylate, methoxytriethylene glycol(meth)acrylate, neopentyl glycol benzoate(meth)acrylate, nonylphenoxy-polyethylene glycol(meth)acrylate, nonylphenoxypolypropylene glycol(meth)acrylate, octyl(meth)acrylate, paracumylphenoxyethylene glycol(meth)acrylate, epichlorohydrin (referred to as "ECH", hereinafter)-modified phenoxy acrylate, phenoxyethyl(meth)acrylate, phenoxydiethylene glycol (meth)acrylate, phenoxyhexaethylene glycol(meth)acrylate, phenoxytetraethylene glycol(meth)acrylate, polyethylene glycol(meth)acrylate, polyethylene glycol-polypropylene glycol(meth)acrylate, polypropylene glycol(meth)acrylate, stearyl(meth)acrylate, EO-modified succinyl(meth)acrylate, tribromophenyl(meth)acrylate, EO-modified tribromophenyl(meth)acrylate, tridodecyl (meth)acrylate, p-isopropenyl phenol, N-vinylpyrrolidone, and N-vinylcaprolactam.

Among the monofunctional polymerizable monomer having an ethylenic unsaturated bond, it is preferable in the present invention to use monofunctional (meth)acrylate compound, from the viewpoint of photo-curing. The monofunctional (meth)acrylate compound is exemplified by those previously exemplified as the monofunctional polymerizable monomer having ethylenic unsaturated bond.

Among these sorts of monofunctional (meth)acrylates having aromatic structure and/or alicyclic hydrocarbon structure, preferable examples include benzyl (meth)acrylate, benzyl (meth)acrylate having a substituent on the aromatic ring (preferable substituent includes $C_{1-6}$ alkyl group, $C_{1-6}$ alkoxy group, cyano group), 1- or 2-naphthyl (meth)acrylate, 1- or 2-naphthylmethyl (meth)acrylate, 1- or 2-naphthylethyl (meth)acrylate, dicyclopentanyl (meth) acrylate, dicyclopentanyloxyethyl (meth)acrylate, isobornyl (meth)acrylate and adamantly (meth)acrylate, more preferable examples include benzyl (meth)acrylate, benzyl (meth)acrylate having a substituent on the aromatic ring, and monofunctional (meth)acrylate compound having a naphthalene structure. Particularly preferable examples include 1- or 2-naphthyl(meth)acrylate, and 1- or 2-naphthylmethyl (meth)acrylate.

In the present invention, it is also preferable to use, as the polymerizable monomer, multifunctional polymerizable unsaturated monomer having two or more ethylenic unsaturated bond-containing groups.

Examples of bifunctional polymerizable unsaturated monomer having two or more ethylenic unsaturated bond-containing groups, preferably used in the present invention, include diethylene glycol monoethyl ether (meth)acrylate, dimethyloldicyclopentane di(meth)acrylate, di(meth)acrylated isocyanurate, 1,3-butyrene glycol di(meth)acrylate, 1,4-butanediol di(meth)acrylate, EO-modified 1,6-hexanediol di(meth)acrylate, ECH-modified 1,6-hexanediol di(meth)acrylate, aryloxypolyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalate diacrylate, neopentyl glycol hydroxypivalate di(meth)acrylate, neopentyl glycol di(meth)acrylate, EO-modified neopentylglycol diacrylate, propylene oxide (referred to as "PO", hereinafter)-modified neopentyl glycol diacrylate, caprolactone-modified neopentyl glycol hydroxypivalate, stearic acid-modified pentaerythritol di(meth)acrylate, ECH-modified phthalate di(meth)acrylate, poly(ethylene glycol-tetramethylene glycol)di(meth)acrylate, poly(propylene glycol-tetramethylene glycol)di(meth) acrylate, polyester (di)acrylate, polyethylene glycol di(meth)acrylate, polypropylene glycol di(meth)acrylate, ECH-modified propylene glycol di(meth)acrylate, silicon di(meth)acrylate, triethylene glycol di(meth)acrylate, tetraethylene glycol di(meth)acrylate, dimethylol tricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene urea, divinylpropylene urea, o-, m-, p-xylylene di(meth)acrylate, 1,3-adamantane diacrylate, and norbornane dimethanol diacrylate.

Among them, particularly preferable for use in the present invention is bifunctional (meth)acrylate such as neopentyl glycol di(meth)acrylate, 1,9-nonanediol di(meth)acrylate, tripropylene glycol di(meth)acrylate, tetraethylene glycol di(meth)acrylate, neopentyl glycol hydroxypivalate di(meth)acrylate, polyethylene glycol di(meth)acrylate, o-, m-, p-benzene di(meth)acrylate, and o-, m-, p-xylylene di(meth) acrylate.

Examples of the multifunctional polymerizable unsaturated monomer having three or more ethylenic unsaturated bond-containing groups include ECH-modified glycerol tri (meth)acrylate, EO-modified glycerol tri(meth)acrylate, PO-modified glycerol tri(meth)acrylate, pentaerythritol triacrylate, EO-modified phosphoric triacrylate, trimethylolpropane tri(meth)acrylate, caprolactone-modified trimethyloipropane tri(meth)acrylate, EO-modified trimethyloipropane tri(meth)acrylate, PO-modified trimethyloipropane tri(meth)acrylate, tris(acryloxyethyl) isocyanurate, dipentaerythritol hexa(meth)acrylate, caprolactone-modified dipentaerythritol hexa(meth)acrylate, dipentaerythritol hydroxypenta(meth)acrylate, alkyl-modified dipentaerythritol penta(meth)acrylate, dipentaerythritol poly(meth)acrylate, alkyl-modified dipentaerythritol tri (meth)acrylate, ditrimethylolpropane tetra(meth)acrylate, pentaerythritolethoxy tetra(meth)acrylate, and pentaerythritol tetra(meth)acrylate.

Among them, particularly preferable for use in the present invention is trifunctional or higher functional (meth)acrylate such as EO-modified glycerol tri(meth)acrylate, PO-modified glycerol tri(meth)acrylate, trimethylolpropane tri(meth) acrylate, EO-modified trimethylolpropane tri(meth)acrylate, PO-modified trimethylolpropane tri(meth)acrylate, dipentaerythritol hexa(meth)acrylate, pentaerythritol ethoxytetra (meth)acrylate, and pentaerythritol tetra(meth)acrylate.

Among the multifunctional polymerizable unsaturated monomers having two or more ethylenic unsaturated bonds, multifunctional (meth)acrylate is preferably used in the present invention from the viewpoint of photo-curability. Note that the multifunctional (meth)acrylate herein is a general name for bifunctional (meth)acrylates and three or higher functional (meth)acrylates. Specific examples of the multifunctional (meth)acrylates include various multifunctional (meth)acrylates which were previously exemplified as the multifunctional polymerizable unsaturated monomer having two ethylenic unsaturated bonds, and as the multifunctional polymerizable unsaturated monomer having three or more ethylenic unsaturated bonds.

A compound having an oxirane ring (epoxy compound) is exemplified by polyglycidyl esters of polybasic acid, polyglycidyl ethers of polyhydric alcohol, polyglycidyl ethers of polyoxyalkylene glycol, polyglycidyl ethers of aromatic polyol, hydrogenated compounds of polyglycidyl ethers of aromatic polyol, urethane polyepoxy compound and epoxylated polybutadienes. Only a single species of these compounds may be used independently, or two or more species may be used in combination.

The compounds (epoxy compound) having an oxirane ring preferably used in the present invention are those described in paragraph [0053] of JP-A-2009-73078.

Among them, bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, and polypropylene glycol diglycidyl ether are particularly preferable.

Commercially available glycidyl group-containing compounds preferably used herein are those described in paragraph [0055] of JP-A-2009-73078. They may be used independently, or two or more species may be used in combination.

These compounds having an oxirane ring may be manufactured by arbitrary methods, and may be synthesized referring, for example, to literatures such as "*Jikken Kagaku Koza (The Course of Experimental Chemistry)*" 20, *Yukigosei (Organic Synthesis)* II, 4th Edition, 213-, 1992, Published by Maruzen Co., Ltd.; "*The Chemistry Of Heterocyclic Compounds-Small Ring Heterocycles, Part* 3 *Oxiranes*", Edited by Alfred Hassner, John & Wiley and Sons, AN Interscience Publication, New York, 1985; Yoshimura, *Secchaku*, Vol. 29, No. 12, 32, 1985; Yoshimura, *Secchaku*, Vol. 30, No. 5, 42, 1986; Yoshimura, *Secchaku*, Vol. 30, No. 7, 42, 1986; JP-A-H11-100378, Japanese Patent No. 2906245, and Japanese Patent No. 2926262.

Vinyl ether compound may be used as the other polymerizable monomers used in the present invention. The vinyl ether compound is arbitrarily selectable, typically from 2-ethylhexyl vinyl ether, butanediol-1,4-divinyl ether, diethylene glycol monovinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanedioldivinyl ether, tetraethylene glycol divinyl ether, pentaerythritol divinyl ether, pentaerythritol trivinyl ether, pentaerythritol tetravinyl ether, solbitol tetravinyl ether, solbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, and bisphenol A divinyloxyethyl ether.

These vinyl ether compounds are synthesized by a method described, for example, in Stephen. C. Lapin, *Polymers Paint Colour Journal.*, 179 (4237), 321 (1989), that is, a method based on a reaction of a polyhydric alcohol or polyhydric phenol with acetylene, or a reaction of a polyhydric alcohol or a polyhydric phenol with a halogenated alkyl vinyl ether. Only a single species of them may be used independently, or two or more species may be used in combination.

Also styrene derivative is usable as the polymerizable monomer in the present invention. The styrene derivative is exemplified by styrene, p-methylstyrene, p-methoxystyrene, β-methylstyrene, p-methyl-β-methylstyrene, α-methylstyrene, p-methoxy-β-methylstyrene, and p-hydroxystyrene.

The curable composition for imprint of the present invention also preferably contains a polymerizable oligomer and/or polymerizable polymer which has a molecular weight still larger than that of the polymerizable monomer, from the viewpoint of controlling resistance to dry etching, adequacy for imprinting, and curability. The polymerizable oligomer is exemplified by various acrylate oligomers such as polyester acrylate, urethane acrylate, polyether acrylate and epoxy acrylate. The amount of addition of the oligomer component is preferably 0 to 30% by mass, more preferably 0 to 20% by mass, furthermore preferably 0 to 10% by mass, and most preferably 0 to 5% by mass. The polymer component preferably has a polymerizable functional group in the side chain thereof. The polymer component preferably has a weight-average molecular weight of 2,000 to 100,000 from the viewpoint of compatibility with the polymerizable monomer, and more preferably 5,000 to 50,000. The amount of addition of the polymer component is preferably 0 to 30% by mass relative to the components of the composition excluding the solvent, more preferably 0 to 20% by mass, furthermore preferably 0 to 10% by mass, and most preferably 2% by mass or less. The curable composition for imprint of the present invention will be improved in the pattern formability, when the content of the polymer component having a molecular weight of 2,000 or larger is 30% by mass or less in the components excluding the solvent.

It is preferable for the curable composition of the present invention to further contain a polymerizable monomer having at least either one of fluorine atom and silicon atom. The polymerizable monomer in the present invention, having at least either one of fluorine atom and silicon atom, is a compound having at least one fluorine atom-containing group, silicon atom-containing group, or group having both of fluorine atom and silicon atom, and at least one polymerizable functional group. The polymerizable functional group is preferably methacryloyl group or epoxy group.

In the curable composition for imprint of the present invention, content of the polymerizable monomer having at least either one of fluorine atom and silicon atom is not specifically limited. However, from the viewpoint of improving curability and reducing viscosity of the composition, the content is preferably 0.1 to 20% by mass of the total polymerizable monomers, more preferably 0.2 to 15% by mass, furthermore preferably 0.5 to 10% by mass, and particularly 0.5 to 5% by mass.

(1) Polymerizable Monomer Having Fluorine Atoms

A group having fluorine atoms, owned by the polymerizable monomer having fluorine atoms, is preferably a fluorine-containing group selected from fluoroalkyl group and fluoroalkyl ether group.

The fluoroalkyl group is preferably a $C_{2-20}$ fluoroalkyl group, and more preferably $C_{4-8}$ fluoroalkyl group. Preferable examples of the fluoroalkyl group include trifluoromethyl group, pentafluoroethyl group, heptafluoropropyl group, hexafluoroisopropyl group, nonafluorobutyl group, tridecafluorohexyl group, and heptadecafluorooctyl group.

In the present invention, the polymerizable monomer having fluorine atoms is preferably a polymerizable monomer having a trifluoromethyl group structure. By virtue of the trifluoromethyl group structure, the polymerizable compound having fluorine atoms can exhibit the effects of the present invention with only a small amount of addition (10% by mass or below, for example), so that the compatibility with the other component may be improved, the line edge roughness after dry-etched may be improved, and the repetitive patternability may be improved.

Similarly to the case of fluoroalkyl group, the fluoroalkyl ether group preferably has a trifluoromethyl group, wherein the one having perfluoroethylenoxy group or perfluoropropylenoxy group is preferable. The fluoroalkyl ether group is preferably a fluoroalkyl ether unit having a trifluoromethyl group such as —(CF(CF₃)CF₂O)—, and/or the one having a trifluoromethyl group at the terminal of the fluoroalkyl ether group.

The total number of fluorine atoms owned by the polymerizable monomer having fluorine atoms is preferably 6 to 60 per molecule, more preferably 9 to 40, furthermore preferably 12 to 40, and particularly 12 to 20.

The polymerizable monomer having fluorine atoms has a ratio of fluorine content of 20 to 60%. If the polymerizable compound having at least either one of fluorine atoms and silicon atoms is a polymerizable compound, the ratio of fluorine content is preferably 20 to 60%, and more preferably 35 to 60%. By adjusting the ratio of fluorine content in an appropriate range, the polymerizable monomer will have a good compatibility with the other component, reduced in mold pollution, improved in the line edge roughness after dry etching, and improved in the repetitive patternability. In this specification, the fluorine content ratio is given by the equation below.

Fluorine content =
$$\frac{\text{(Number of fluorine atoms in polymerizable monomer)} \times \text{(Atomic weight of fluorine atom)}}{\text{Molecular weight of compound}} \times 100$$

A fluorine atom-containing group in the polymerizable compound having fluorine atoms is exemplified by compounds having a partial structure represented by the formula (I) below. By using the compound having this sort of partial structure, the curable composition will exhibit a good patternability even after repetitive pattern transfer, and will ensure a good long-term stability.

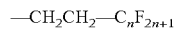  Formula (I)

In the formula (I), n represents an integer of 1 to 8, and preferably an integer of 4 to 6.

Other preferable examples of the polymerizable monomer having fluorine atoms include the compound having a partial structure represented by the formula (II) below. The compound may, of course, have both of the partial structure represented by the formula (I), and the partial structure represented by the formula (II).

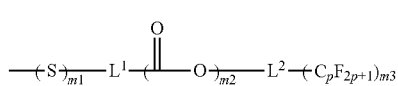

Formula (II)

In the formula (II), $L^1$ represents a single bond or $C_{1-8}$ alkylene group, $L^2$ represents a $C_{1-8}$ alkylene group, each of m1 and m2 independently represents 0 or 1, and at least one of m1 and m2 is 1. m3 represents an integer of 1 to 3, and p represents an integer of 1 to 8. When m3 is 2 or larger, the individual $(-C_pF_{2p+1})$s may be same or different.

It is preferable that each of $L^1$ and $L^2$ independently represents a $C_{1-4}$ alkylene group. The alkylene group may have a substituent without departing from the spirit of the present invention. m3 is preferably 1 or 2. p is preferably an integer of 4 to 6.

Specific examples of the polymerizable monomer having fluorine atoms, used for the photo-curable composition used in the present invention, will be shown below without limiting the present invention.

The polymerizable monomer having fluorine atoms is exemplified by monofunctional polymerizable monomer having fluorine atoms, such as trifluoroethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth)acrylate, tetrafluoropropyl (meth)acrylate, and hexafluoropropyl (meth) acrylate. As the polymerizable monomer having fluorine atoms, also preferably exemplified are multi-functional polymerizable monomers having two or more polymerizable functional groups, which contain di(meth)acrylate having fluoroalkylene groups, such as 2,2,3,3,4,4-hexafluoropentane di(meth)acrylate and 2,2,3,3,4,4,5,5-octafluorohexane di(meth)acrylate.

Also compounds having two or more fluorine-containing groups in one molecule, such as fluoroalkyl group or fluoroalkyl ether group, are preferably used.

The compounds having two or more fluoroalkyl groups or fluoroalkyl ether groups in one molecule are preferably polymerizable monomers represented by the formula (III) below:

Formula (III)

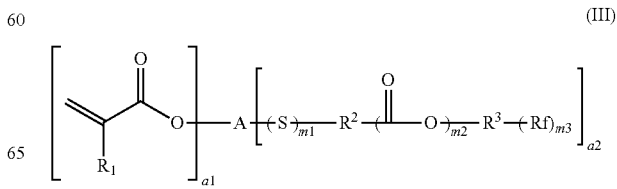

(in the formula (III), $R^1$ represents a hydrogen atom, alkyl group, halogen atom or cyano group, preferably represents a hydrogen atom or alkyl group, more preferably represents a hydrogen atom or methyl group, and furthermore preferably represents a hydrogen atom.

"A" represents an (a1+a2)-valent linking group, preferably represents a linking group having an alkylene group and/or arylene group, and may further contain a linking group having a hetero atom. The linking group having a hetero atom is exemplified by —O—, —C(=O)O—, —S— and —C(=O)—. While these groups may have a substituent without departing from the spirit of the present invention, they preferably have no substituent. "A" preferably has 2 to 50 carbon atoms, and more preferably has 4 to 15 carbon atoms.

a1 represents an integer of 1 to 6, preferably 1 to 3, and furthermore preferably 1 or 2.

a2 represents an integer of 2 to 6, preferably 2 or 3, and furthermore preferably 2.

Each of $R^2$ and $R^3$ independently represents a single bond or $C_{1-8}$ alkylene group. Each of m1 and m2 independently represents 0 or 1, and m3 represents an integer of 1 to 3.)

When a1 is 2, the individual (A)s may be same or different.

When a2 is 2, the individual ($R^2$)s, ($R^3$)s, (m1)s, (m2)s and (m3)s, respectively, may be same or different.

Rf represents a fluoroalkyl group or fluoroalkyl ether group, and preferably represents a $C_{1-8}$ fluoroalkyl group, or $C_{3-20}$ fluoroalkyl ether group.

(2) Polymerizable Monomer Having Silicon Atom(s)

Functional group having silicon atom(s), owned by the polymerizable monomer having silicon atom(s), is exemplified by trialkylsilyl group, chain-like siloxane structure, cyclic siloxane structure, and basket-like siloxane structure. From the viewpoints of compatibility with other component and mold releasability, functional groups having a trimethylsilyl group or dimethylsiloxane structure are preferable.

The polymerizable monomer having silicon atom(s) is exemplified by 3-tris(trimethylsilyloxy)silylpropyl (meth) acrylate, trimethylsilylethyl (meth)acrylate, (meth)acryloxymethyl bis(trimethylsiloxy)methylsilane, (meth)acryloxymethyl tris(trimethylsiloxy)silane, 3-(meth) acryloxypropyl bis(trimethylsiloxy)methylsilane, and polysiloxane having a (meth)acryloyl group at the terminal or in the side chain (for example, X-22-164 Series, X-22-174DX, X-22-2426 and X-22-2475 from Shin-Etsu Chemical Co., Ltd.).

Besides them, the polymerizable monomer usable in the present invention also includes propenyl ether and butenyl ether. The propenyl ether and butenyl ether are exemplified by 1-dodecyl-1-propenyl ether, 1-dodecyl-1-butenyl ether, 1-butenoxymethyl-2-norbornene, 1-4-di(1-butenoxy)butane, 1,10-di(1-butenoxy)decane, 1,4-di(1-butenoxymethyl) cyclohexane, diethylene glycol di(1-butenyl)ether, 1,2,3-tri (1-butenoxy)propane, and propenyl ether propylene carbonate.

Also a series of polymerizable monomers represented by the formula (I) are exemplified as the polymerizable monomer used in the present invention.

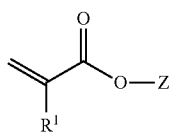

(I)

(In the formula (I), Z represents a group containing an aromatic group and having a molecular weight of 100 or larger, and $R^1$ represents a hydrogen atom, alkyl group or halogen atom. If the polymerizable monomer (Ax) is a liquid at 23° C., the viscosity at 23° C. is 500 mPa·s or smaller.)

$R^1$ preferably represents a hydrogen atom or alkyl group, wherein hydrogen atom or methyl group is preferable. From the viewpoint of curability, hydrogen atom is more preferable. The halogen atom is exemplified by fluorine atom, chlorine atom, bromine atom and iodine atom, among them fluorine atom is preferable.

Z preferably represents an aralkyl group which may have a substituent, aryl group which may have a substituent, or, a group configured by any of these groups bound via a linking group. The linking group referred to herein may contain a hetero atom-containing linking group, and is preferably —$CH_2$—, —O—, —C(=O)—, —S— or groups configured by combining any of them. The aromatic group contained in Z is preferably a phenyl group, wherein it is preferable that only phenyl group is contained. As compared with the polymerizable compounds having polycyclic aromatic group and heteroaromatic group, those having only phenyl group will have lower viscosity, better formability of patterns, and will be able to suppress particle defects. Z preferably has a molecular weight of 100 to 300, and more preferably 120 to 250.

The number of polymerizable groups and the number of aromatic groups, contained in the polymerizable monomer, preferably satisfies (number of polymerizable groups)≤ (number of aromatic groups), from the viewpoint of viscosity and dry etching resistance. In this case, a condensed aromatic ring such as naphthalene is counted as a single aromatic group, whereas two aromatic rings linked via a bond such as biphenyl is counted as two aromatic groups.

The polymerizable monomer, given in the form of liquid at 23° C., preferably has a viscosity at 23° C. of 2 to 500 mPa·s, more preferably 3 to 200 mPa·s, and most preferably 3 to 100 mPa·s. The polymerizable monomer is preferably a liquid at 23° C., or otherwise a solid having a melting point of 60° C. or lower. The form of liquid at 23° C. is more preferable.

Z is preferably a group represented by —$Z^1$—$Z^2$. $Z^1$ now represents a single bond, or a hydrocarbon group which may have in the chain thereof a hetero atom-containing linking group. $Z^2$ is an aromatic group which may have a substituent, and has a molecular weight of 90 or larger.

$Z^1$ is preferably a single bond, or an alkylene group which may have in the chain thereof a hetero atom-containing linking group. $Z^1$ more preferably represents an alkylene group which has in the chain thereof no hetero atom-containing linking group, and is furthermore preferably a methylene group or ethylene group. The hetero atom-containing linking group is exemplified by —O—, —C(=O)—, —S—, and groups configured by combining them with an alkylene group. The hydrocarbon group preferably has 1 to 3 carbon atoms.

$Z^2$ is preferably an aromatic group having a substituent with a molecular weight of 15 or larger. The aromatic group contained in $Z^2$ is exemplified by phenyl group and naphthyl group, and more preferably exemplified by phenyl group having a substituent with a molecular weight of 15 or larger. $Z^2$ is more preferably configured by a monocyclic aromatic group.

$Z^2$ is also preferably a group configured by two or more aromatic groups bound directly, or via a linking group. Also the linking group in this case is preferably a group configured by —$CH_2$—, —O—, —C(=O)—, —S— or combinations of them.

The substituent which may be owned by the aromatic group is exemplified by halogen atom (fluorine atom, chlorine atom, bromine atom, iodine atom), straight-chain, branched or cyclic alkyl group, alkenyl group, alkynyl group, aryl group, acyl group, alkoxycarbonyl group, aryloxycarbonyl group, carbamoyl group, cyano group, carboxy group, hydroxy group, alkoxy group, aryloxy group, alkylthio group, arylthio group, heterocyclic oxy group, acyloxy group, amino group, nitro group, hydrazino group and heterocyclic group. Also groups further substituted by these groups are preferable.

The amount of addition of the compound represented by the formula (I) in the photo-curable composition is preferably 10 to 100% by mass, more preferably 20 to 100% by mass, and particularly 30 to 80% by mass.

The compound represented by the formula is preferably a compound represented by the formula (II) below.

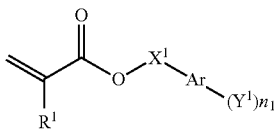

(II)

(In the formula (II), $R^1$ represents a hydrogen atom, alkyl group or halogen atom, and $X^1$ represents a single bond or hydrocarbon group. The hydrocarbon group may contain in the chain thereof a hetero atom-containing linking group. $Y^1$ represents a substituent with a molecular weight of 15 or larger, and n1 represents an integer of 0 to 3. When n1 is 0, then $X^1$ represents a $C_2$ or longer hydrocarbon group. Ar represents an aromatic group or aromatic linking group, wherein phenyl group or phenylene group is preferable.)

$R^1$ is synonymous to $R^1$ in the formula above, again with the same preferable ranges.

$X^1$ is synonymous to $Z^1$ described above, with the same preferable ranges.

$Y^1$ represents a substituent with a molecular weight of 15 or larger, and is exemplified by alkyl group, alkoxy group, aryloxy group, aralkyl group, acyl group, alkoxycarbonyl group, alkylthio group, arylthio group and halogen atom. These substituents may have additional substituents.

When n1 is 0, $X^1$ preferably represents a $C_2$ or $C_3$ alkylene group, meanwhile when n1 is 2, $X^1$ preferably represents a single bond or $C_1$ hydrocarbon group.

In one particularly preferable embodiment, n1 is 1, and $X^1$ represents a $C_{1-3}$ alkylene group.

The compound represented by the formula (II) is furthermore preferably a compound represented by the formula (III).

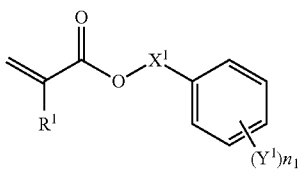

(III)

(In the formula (III), $R^1$ represents a hydrogen atom, alkyl group or halogen atom. $X^1$ represents a single bond, or hydrocarbon group which may contain in the chain thereof a hetero atom-containing linking group. $Y^1$ represents a substituent with a molecular weight of 15 or larger, and n1 represent an integer of 0 to 3. When n1 is 0, $X^1$ then represents a $C_2$ or longer hydrocarbon group.)

$R^1$ is synonymous to $R^1$ in the formula above, again with the same preferable ranges.

$X^1$ is synonymous to $Z^1$ described above, with the same preferable ranges.

$Y^1$ is synonymous to $Y^1$ in the formula (II) above, again with the same preferable ranges.

n1 is synonymous to n1 in formula (II) above, again with the same preferable ranges.

The compound represented by the formula (III) is furthermore preferably a compound represented by any of the formulae (IV) to (VI) below.

Compound Represented by Formula (IV)

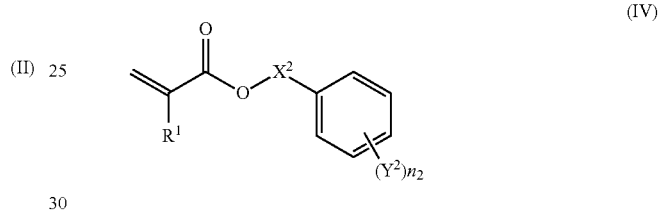

(IV)

(In the formula (IV), $R^1$ represents a hydrogen atom, alkyl group or halogen atom. $X^2$ represents a single bond, or hydrocarbon group which may contain in the chain thereof a hetero atom-containing linking group. $Y^2$ represents a substituent containing no aromatic group with a molecular weight of 15 or larger, and n2 represents an integer of 0 to 3. Note that when n2 is 0, then $X^2$ represents a $C^2$ or $C_3$ hydrocarbon group.)

$R^1$ is synonymous to $R^1$ in the formula above, again with the same preferable ranges.

$X^2$, when representing a hydrocarbon group, is preferably a $C_{1-3}$ hydrocarbon group, preferably a substituted or unsubstituted $C_{1-3}$ alkylene group, and more preferably an unsubstituted $C_{1-3}$ alkylene group or ethylene group. By using the hydrocarbon group like this, the photo-curable composition will now be lower in viscosity and lower in volatility.

$Y^2$ represents a substituent having no aromatic group with a molecular weight of 15 or larger, wherein the upper limit of the molecular weight of $Y^1$ is preferably 80 or smaller. $Y^2$ is preferably represented by $C_{1-6}$ alkyl groups such as methyl group, ethyl group, isopropyl group, tert-butyl group and cyclohexyl group; halogen atoms such as chloro group and bromo group; and $C_{1-6}$ alkoxy group such as methoxy group, ethoxy group, and cyclohexyloxy group.

n2 is preferably an integer of 0 to 2. When n2 is 1, the substituent Y is preferably bound to the para position. From the viewpoint of viscosity, when n2 is 2, then $X^2$ is preferably a single bond or $C_1$ hydrocarbon group.

The compound represented by the formula (IV) is preferably a monofunctional (meth)acrylate having one (meth) acrylate group.

From the viewpoint of balancing low viscosity and low volatility, the (meth)acrylate compound represented by the formula (IV) preferably has a molecular weight of 175 to 250, and more preferably 185 to 245.

The (meth)acrylate compound represented by the formula (IV) preferably has a viscosity at 25° C. of 10 mPa·s or smaller, and more preferably 6 mPa·s or smaller.

The compound represented by the formula (IV) is also preferably usable as a reactive diluent.

The amount of addition of the compound represented by the formula (IV) in the photo-curable composition is preferably 10% by mass or more, from the viewpoint of viscosity of the composition and accuracy of the cured pattern, more preferably 15% by mass or more, and particularly 20% by mass or more. Meanwhile, from the viewpoint of tackiness after the curing and mechanical strength, the amount of addition is preferably 95% by mass or less, more preferably 90% by mass or less, and particularly 85% by mass or less.

Compounds represented by the formula (IV) will be shown below, of course without limiting the present invention. $R^1$ represents a hydrogen atom, alkyl group or halogen atom.

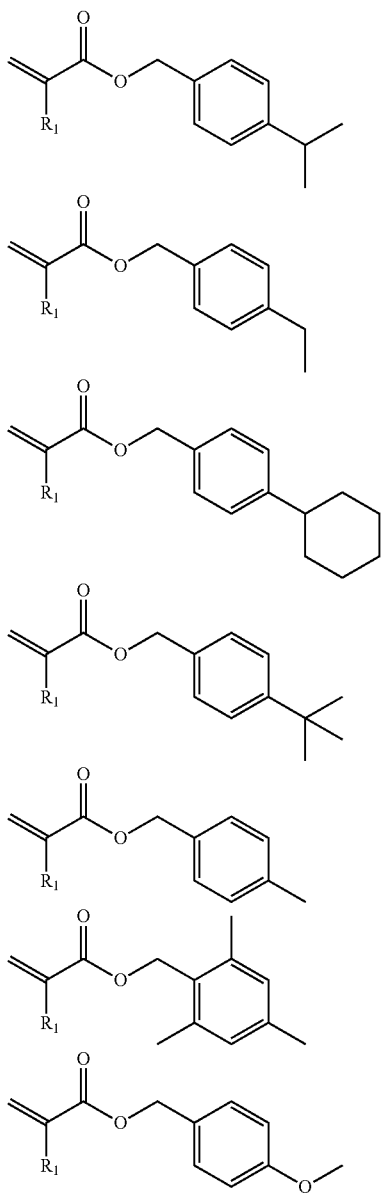

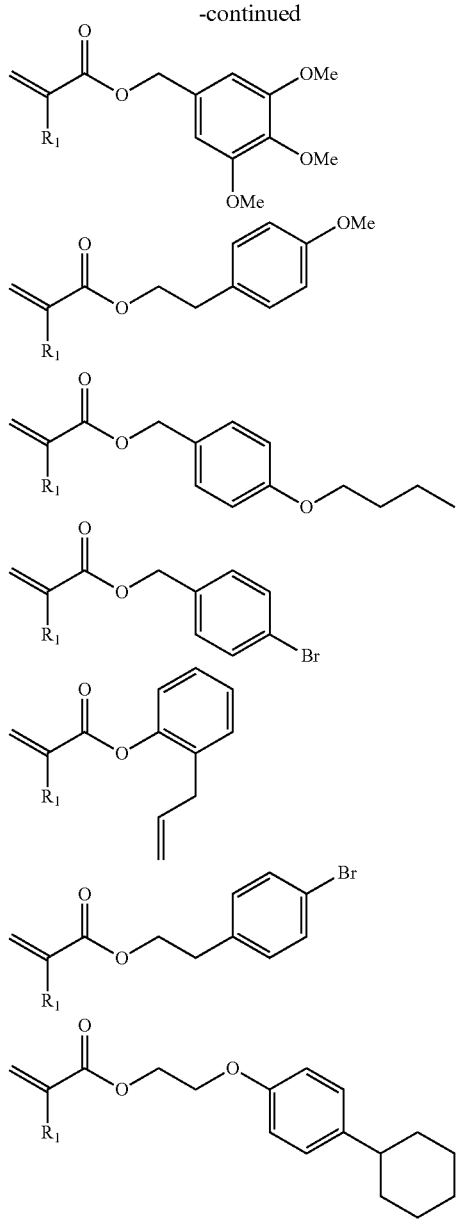

Compound Represented by Formula (V)

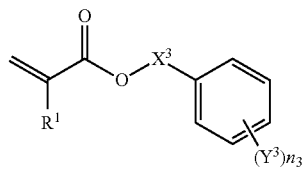

(V)

(In the formula (V), $R^1$ represents a hydrogen atom, alkyl group or halogen atom, and $X^3$ represents a single bond, or hydrocarbon group which may contain in the chain thereof a hetero atom-containing linking group. $Y^3$ represents a substituent having an aromatic group with a molecular weight of 15 or larger, and n3 represents an integer of 1 to 3.)

$R^1$ is synonymous to $R^1$ in the formula above, again with the same preferable ranges.

$X^1$ is synonymous to $Z^1$ described above, again with the same preferable ranges.

$Y^3$ represents a substituent having an aromatic group with a molecular weight of 15 or larger, wherein the substituent having the aromatic group is preferably configured by an aromatic group bound via a single bond or a linking group to the aromatic ring in the formula (V). The linking group is preferably exemplified by alkylene group, linking group having a hetero atom (preferably —O—, —S—, —C(=O)O—), and combinations of them. Alkylene group, —O—, and groups configured by combining them are more preferable. The substituent having an aromatic group with a molecular weight of 15 or larger is preferably a substituent having a phenyl group. The phenyl group is preferably bound via a single bond or the linking group. Particularly preferable examples include phenyl group, benzyl group, phenoxy group, benzyloxy group and phenylthio group. The formula weight of $Y^3$ is preferably 230 to 350.

n3 preferably represents 1 or 2, and more preferably 1.

The amount of addition of the compound represented by the formula (V) in the composition is preferably 10% by mass or more, more preferably 20% by mass or more, and particularly 30% by mass or more. On the other hand, from the viewpoint of tackiness after the curing and mechanical strength, the amount of addition is preferably 90% by mass or less, more preferably 80% by mass or less, and particularly 70% by mass or less.

Compounds represented by the formula (V) will be shown below, of course without limiting the present invention. $R^1$ represents a hydrogen atom, alkyl group or halogen atom.

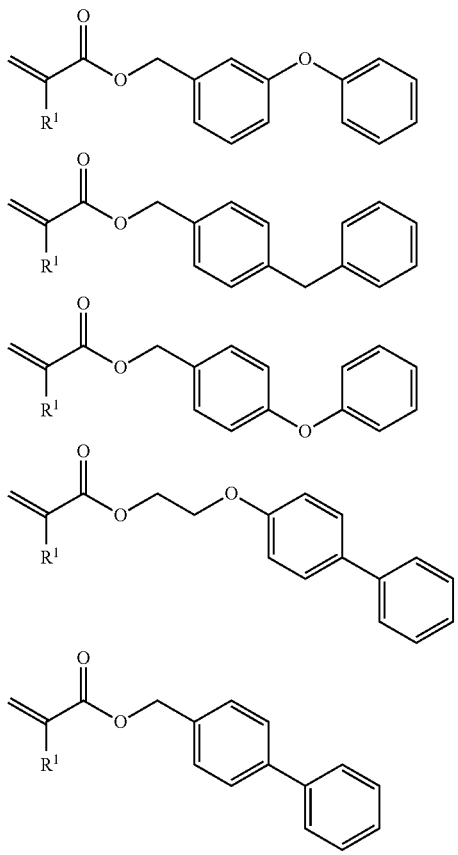

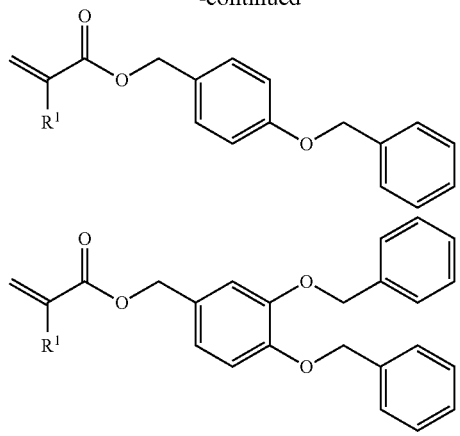

Compound Represented by Formula (VI)

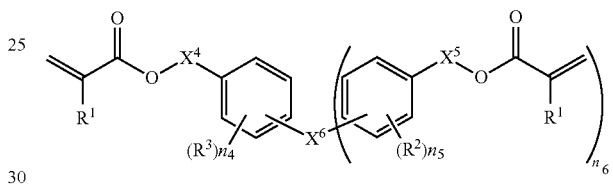

(In the formula (VI), $X^6$ represents an (n6+1)-valent linking group, and each $R^1$ independently represents a hydrogen atom, alkyl group or halogen atom. Each of $R^2$ and $R^3$ independently represents a substituent, and each of n4 and n5 independently represents an integer of 0 to 4. n6 represents 1 or 2, and each of $X^4$ and $X^5$ independently represents a hydrocarbon group which may contain in the chain thereof a hetero atom-containing linking group.)

$X^6$ represents a (n6+1)-valent linking group, and preferably alkylene group, —O—, —S—, —C(=O)O—, or a linking group configured by some of them. The alkylene group is preferably a $C_{1-8}$ alkylene group, and more preferably a $C_{1-3}$ alkylene group. Unsubstituted alkylene group is preferable.

n6 preferably represents 1. When n6 is 2, each of a plurality of $R^1$, $X^5$ and $R^2$ may be same or different.

Each of $X^4$ and $X^5$ independently represents an alkylene group which contains no linking group, more preferably a $C_{1-5}$ alkylene group, furthermore preferably a $C_{1-3}$ alkylene group, and most preferably a methylene group.

$R^1$ is synonymous to $R^1$ in the formula, again with the same preferable ranges.

Each of $R^2$ and $R^3$ independently represents a substituent, which is preferably an alkyl group, halogen atom, alkoxy group, acyl group, acyloxy group, alkoxycarbonyl group, cyano group, or nitro group. The alkyl group is preferably a $C_{1-8}$ alkyl group. The halogen atom is exemplified by fluorine atom, chlorine atom, bromine atom and iodine atom, wherein fluorine atom is preferable. The alkoxy group is preferably a $C_{1-8}$ alkoxy group. The acyl group is preferably a $C_{1-8}$ acyl group. The acyloxy group is preferably a $C_{1-8}$ acyloxy group. The alkoxycarbonyl group is preferably a $C_{1-8}$ alkoxycarbonyl group.

Each of n4 and n5 independently represents an integer of 0 to 4. When n4 or n5 is 2 or larger, each of a plurality of $R^2$ and $R^3$ may be same or different.

The compound represented by the formula (VI) is preferably a compound represented by the formula (VII) below.

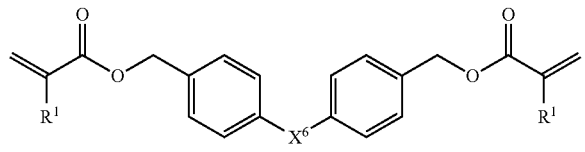

($X^6$ represents an alkylene group, —O—, —S—, or a linking group configured by combining some of them, and each $R^1$ independently represents a hydrogen atom, alkyl group or halogen atom.)

$R^1$ is synonymous to $R^1$ in the formula, again with the same preferable ranges.

$X^6$, when representing an alkylene group, is preferably a $C_{1-8}$ alkylene group, and more preferably a $C_{1-3}$ alkylene group. Also an unsubstituted alkylene group is preferable.

$X^6$ is preferably —$CH_2$—, —$CH_2CH_2$—, —O— or —S—.

While not specifically limited, the content of the compound represented by the formula (VI) in the photo-curable composition used in the present invention is preferably 1 to 100% by mass of the total polymerizable monomers, from the viewpoint of curability and viscosity of the composition, more preferably 5 to 70% by mass, and particularly 10 to 50% by mass.

The compounds represented by the formula (VI) will be shown below, of course without limiting the present invention. Each $R^1$ in the formulae below is synonymous to $R^1$ in the formula (VI), with the same preferable ranges. Hydrogen atom is particularly preferable.

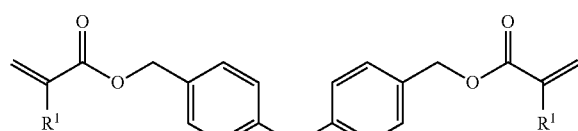

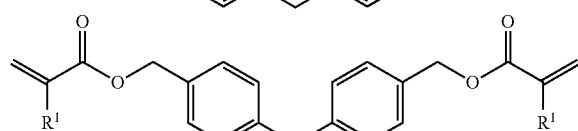

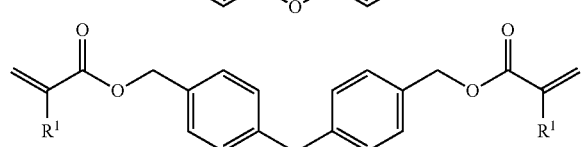

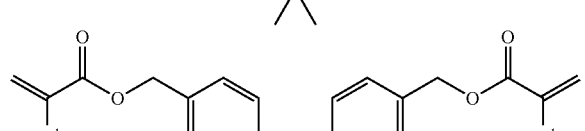

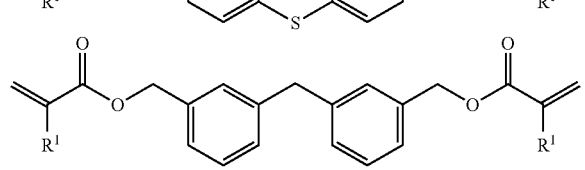

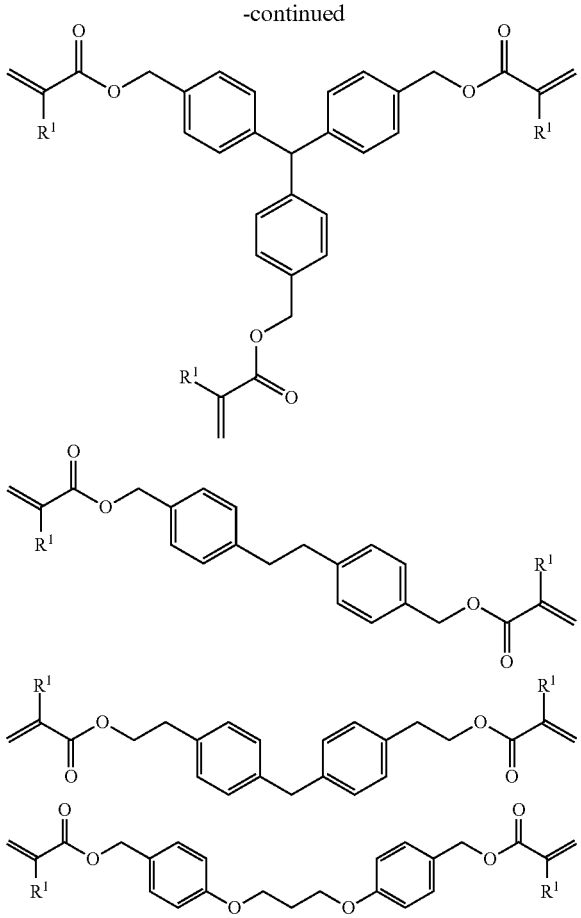

Furthermore, also a group of polymerizable monomers represented by the formula below are exemplified as the polymerizable monomer usable in the present invention.

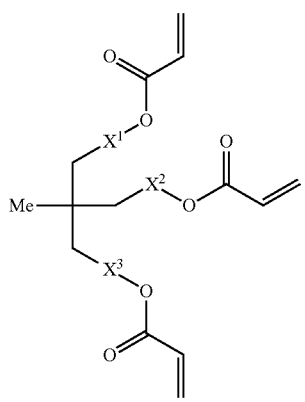

(In the formula, each of $X^1$ to $X^3$ independently represents a single bond or linking group. Me represents a methyl group.)

Each of $X^1$ to $X^3$, when representing a linking group, is preferably an organic linking group, and more preferably a $C_{1-50}$ organic linking group. The organic linking group is specifically exemplified by oxyalkylene group, —O—C(=O)—, alkylene group and groups composed of two or more of them. The oxyalkylene group is exemplified by ethylene oxide group and propylene oxide group. The alkylene group is exemplified by propylene group, butyrene group, pentyl group and hexyl group. Each of $X^1$ to $X^3$ is preferably a single bond.

The compound represented by the formula is preferably a liquid at 23° C., but not always necessarily.

Specific examples of the polymerizable monomer in the present invention will be shown below.

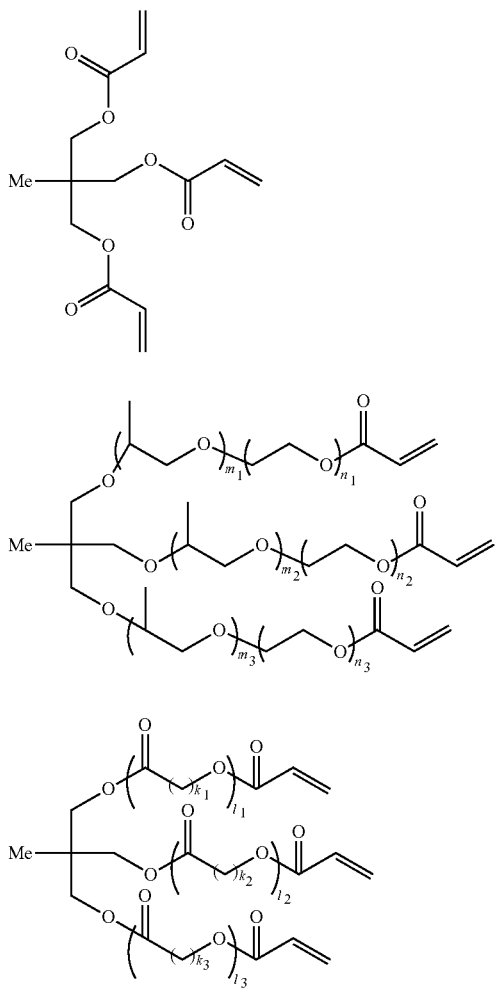

Each of $m^1$, $m^2$, $m^3$, $n^1$, $n^2$ and $n^3$ independently represents an integer of 0 to 10. The polymerizable compound is a compound having a total of $m^1$, $m^2$, $m^3$, $n^1$, $n^2$ and $n^3$ larger than 1, or a mixture having an average of the total values larger than 1.

Each of $l^1$, $l^2$, $l^3$ independently represents an integer of 0 to 10, and each of $k^1$, $k^2$, $k^3$ independently represents an integer of 3 to 6. The polymerizable compound is a compound having a total of $l^1$, $l^2$ and $l^3$ of larger than 1, or a mixture having an average of the total values of larger than 1.

Also a group of polymerizable monomer represented by the formula below is exemplified as the polymerizable monomer usable in the present invention.

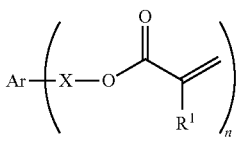

[In the formula, Ar represents an arylene group which may have a substituent, X represents a single bond or organic linking group, $R^1$ represents a hydrogen atom or methyl group, and n represents 2 or 3.]

In the formula, the arylene group is exemplified by hydrocarbon-based arylene groups such as phenylene group and naphthylene group; and heteroarylene groups having indole or carbazole as the linking group. The arylene group is preferably hydrocarbon-based arylene group, and more preferably phenylene group from the viewpoint of etching resistance. The arylene group may have a substituent, wherein preferable examples of the substituent include alkyl group, alkoxy group, hydroxy group, cyano group, alkoxycarbonyl group, amide group, and sulfonamide group.

The organic linking group represented by X is exemplified by alkylene group which may have a hetero atom in the chain thereof, arylene group, and aralkylene group. Among them, alkylene group and oxyalkylene group are preferable, and alkylene group is more preferable. It is particularly preferable for X to represent a single bond or alkylene group.

$R^1$ represents a hydrogen atom or methyl group, and preferably a hydrogen atom.

n represents 2 or 3, and preferably 2.

The polymerizable monomer is preferably any of those represented by the formulae (I-a) and (I-b) below, from the viewpoint of decreasing viscosity of the composition.

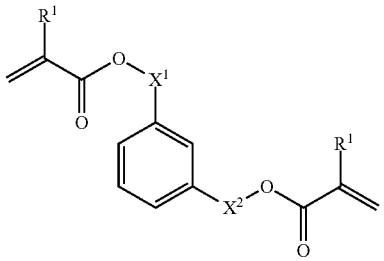

Formula (I-a)

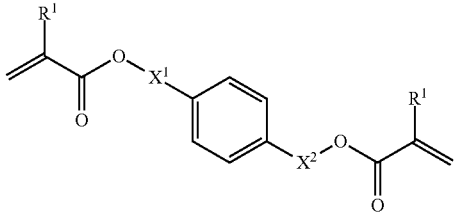

Formula (I-b)

[In the formulae, each of $X^1$ and $X^2$ independently represents a single bond or alkylene group which may have a $C_{1-3}$ substituent, and $R^1$ represents a hydrogen atom or methyl group.]

In the formula (I-a), $X^1$ preferably represents a single bond or methylene group, and more preferably represents a methylene group from the viewpoint of reducing the viscosity.

Preferable range of $X^2$ is same as that of $X^1$.

$R^1$ is synonymous to $R^1$ in the formula (I), with the same preferable ranges.

The polymerizable monomer is preferably a liquid at 23° C., since it will suppress insoluble matters from generating even under an increased amount of addition.

Specific examples of preferable polymerizable monomer will be shown below. $R^1$ is synonymous to $R^1$ in the formula, and represents a hydrogen atom or methyl group. The present invention is, however, not limited to the specific examples below.

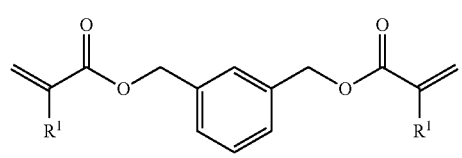
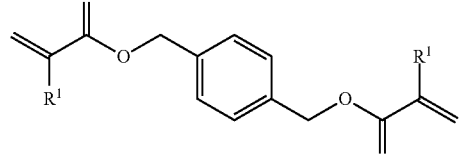
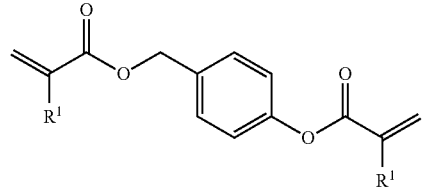
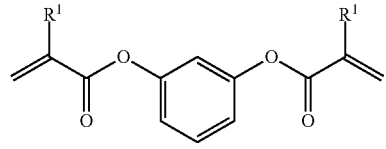
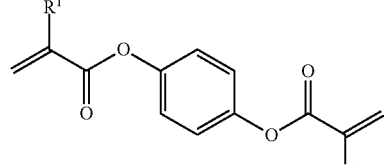
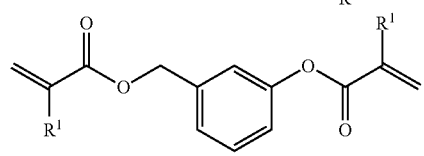
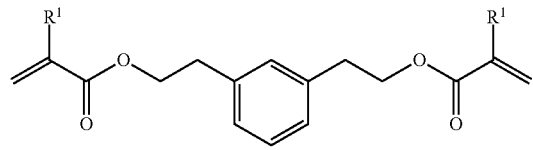
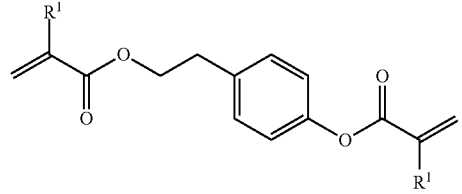

-continued

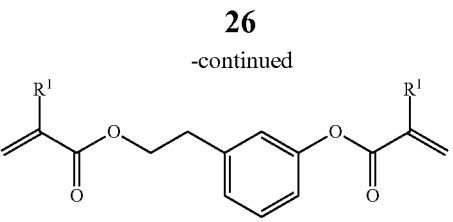
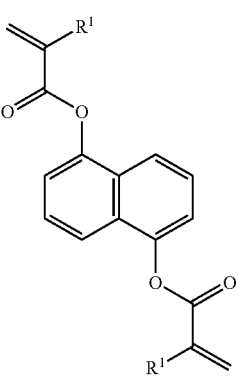
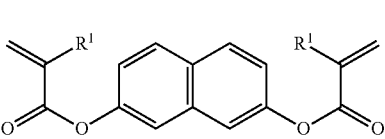
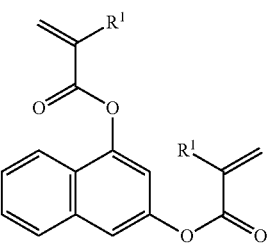
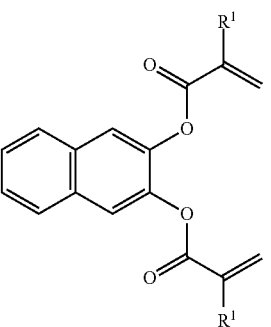
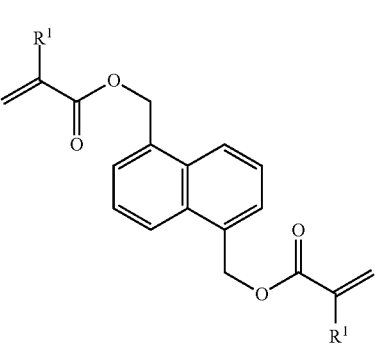

-continued

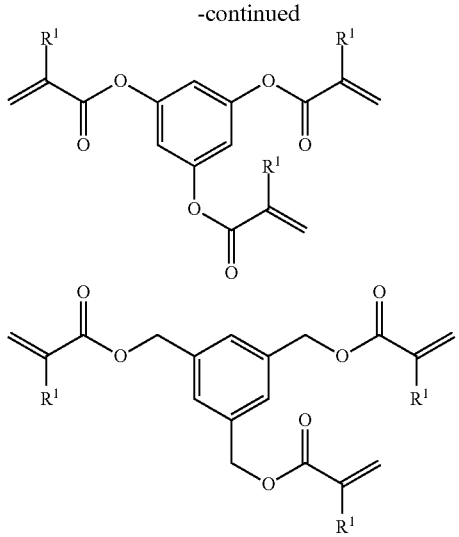

Among these polymerizable monomers, (A) polymerizable monomer is preferably a (meth)acrylate compound from the viewpoint of viscosity of the composition and photo-curability, wherein acrylate is more preferable. In the present invention, also multifunctional polymerizable monomer having two or more polymerizable functional groups is preferable.

In the present invention, it is particularly preferable to adjust the ratio of mixing of the monofunctional (meth)acrylate compound and the multifunctional (meth)acrylate compound to 80/20 to 0/100 on the weight basis, more preferably 70/30 to 0/100, and furthermore preferably 40/60 to 0/100. By selecting an appropriate ratio, the composition will successfully have a sufficient level of curability and low viscosity.

In the multifunctional (meth)acrylate compound, the ratio of content of the bifunctional (meth)acrylate and the trifunctional or higher functional (meth)acrylate is preferably 100/0 to 20/80 on the mass basis, more preferably 100/0 to 50/50, and furthermore preferably 100/0 to 70/30. Since the trifunctional or higher functional (meth)acrylate has the viscosity larger than that of the bifunctional (meth)acrylate, so that the curable composition for imprint of the present invention may advantageously be reduced in viscosity, as the content of the bifunctional (meth)acrylate becomes larger.

The (A) polymerizable monomer preferably contains a compound which contains a substituent having an aromatic structure and/or alicyclic hydrocarbon structure from the viewpoint of etching resistance, wherein the content of the polymerizable monomer having an aromatic structure and/or alicyclic hydrocarbon structure is more preferably 50% by mass or more in the (A) component, and furthermore preferably 80% by mass or more. The polymerizable monomer having an aromatic structure is preferably an (meth)acrylate compound having an aromatic structure. Particularly preferable examples of the (meth)acrylate compound having an aromatic structure include monofunctional (meth)acrylate compounds having a naphthalene structure, such as 1- or 2-naphthyl (meth)acrylate, 1- or 2-naphthylmethyl (meth) acrylate, and 1- or 2-naphthylethyl (meth)acrylate; monofunctional acrylates such as benzyl acrylate having a substituent on the aromatic ring; and bifunctional acrylates such as catechol diacrylate, and xylylene glycol diacrylate. The polymerizable compound having an alicyclic hydrocarbon structure is preferably isoboronyl (meth)acrylate, Dicyclopentanyl (meth)acrylate, dicyclopentanyloxyethyl (meth) acrylate, dicyclopentenyl(meth)acrylate, adamantly (meth) acrylate, tricyclodecanyl(meth)acrylate, or tetracyclododecanyl (meth)acrylate.

When the (meth)acrylates are used as the (A) polymerizable monomer, acrylates are preferred over methacrylates.

It is particularly preferable for the curable composition for imprint of the present invention to contain, as the (A) polymerizable monomer, both of the (meth)acrylate compound having an aromatic structure and the fluorine atom-containing (meth)acrylate. As for the ratio of content, it is preferable that the (meth)acrylate compound having an aromatic structure accounts for 80% by mass or more of the total (A) polymerizable monomer component, and the fluorine atom-containing (meth)acrylate accounts for 0.1 to 10% by mass. Particularly preferable is a blended system configured by the (meth)acrylate compound having an aromatic structure which exists as a liquid at 1 atm at 23° C., and the fluorine atom-containing (meth)acrylate which is a solid at 1 atom at 23° C.

The total content of the (A) polymerizable monomer in the curable composition for imprint of the present invention is preferably 50 to 99.5% by mass in the whole components excluding the solvent, from the viewpoint of improving the curability and of improving the viscosity of the curable composition for imprint of the present invention, more preferably 70 to 99% by mass, and particularly 90 to 99% by mass.

In the (A) polymerizable monomer component in the curable composition for imprint of the present invention, preferably the polymerizable monomer having a viscosity at 23° C. of 3 to 100 mPa·s accounts for 80% by mass or more of the total polymerizable monomers, more preferably the polymerizable monomer having a viscosity of 3 to 70 mPa·accounts for 80% by mass or more, furthermore preferably the polymerizable monomer having a viscosity of 7 to 50 mPa·s accounts for 80% by mass or more, and most preferably the polymerizable monomer having a viscosity of 8 to 30 mPa·s accounts for 80% by mass or more.

In the (A) polymerizable monomer contained in the curable composition for imprint of the present invention, the polymerizable compound which exists as a liquid at 23° C. preferably accounts for 50% by mass or more in the total polymerizable monomers, from the viewpoint of stability over time.

(B) Photo-Polymerization Initiator

The curable composition for imprint of the present invention contains a photo-polymerization initiator. The photo-polymerization initiator used in the present invention is arbitrarily selectable from those capable of producing an active species, which acts to polymerize the (A) polymerizable monomer, upon being irradiated with light. The photo-polymerization initiator is exemplified by cationic polymerization initiator, and radical polymerization initiator, wherein the radical polymerization initiator is preferable. In the present invention, a plurality of species of the photo-polymerization initiator may be used in combination.

Content of the photo-polymerization initiator used in the present invention typically accounts for 0.01 to 15% by mass, preferably 0.1 to 12% by mass, and furthermore preferably 0.2 to 7% by mass of the whole components excluding the solvent. For the case where two or more species of the photo-polymerization initiator are used, the total content falls in the above-described ranges.

A content of the photo-polymerization initiator of 0.01% by mass or more is preferable, since the sensitivity (rapid curability), resolution, line edge roughness performance, and film strength tend to improve. On the other hand, a content of the photo-polymerization initiator of 15% by mass or less is preferable, since the translucency, coloration and handleability tend to improve. In the system containing dye and/or pigment, they may act as a radical trapping agent, and may adversely affect the photo-polymerization performance and sensitivity. Taking this point into consideration, the amount of addition of the photo-polymerization initiator is optimized for these applications. On the other hand, the dye and/or pigment are not essential components for the composition used in the present invention, so that the optimum range of the photo-polymerization initiator may be different from that in the field of curable composition for color filters in liquid crystal display devices.

The radical photo-polymerization initiator used in the present invention is selectable, for example, from those commercially available. The examples include those described, for example, in paragraph [0091] of JP-A-2008-105414, which are preferably used. Among them, acetophenone-based compound, acylphosphine oxide-based compound, and oxime ester-based compound are preferable from the viewpoints of curing sensitivity and absorption characteristics.

The acetophenone-based compound is preferably exemplified by hydroxyacetophenone-based compound, dialkoxyacetophenone-based compound, and aminoacetophenone-based compound. The hydroxyacetophenone-based compound is preferably exemplified by Irgacure (registered trademark) 2959 (1-[4-(2-hydroxyethoxy)phenyl]-2-hydroxy-2-methyl-1-propane-1-one, Irgacure (registered trademark) 184 (1-hydroxycyclohexyl phenylketone), Irgacure (registered trademark) 500 (1-hydroxycyclohexyl phenylketone, benzophenone), and Darocur (registered trademark) 1173 (2-hydroxy-2-methyl-1-phenyl-1-propane-1-one), all commercially available from Ciba.

The dialkoxyacetophenone-based compound is preferably exemplified by Irgacure (registered trademark) 651 (2,2-dimethoxy-1,2-diphenylethane-1-one) commercially available from Ciba.

The aminoacetophenone-based compound is preferably exemplified by Irgacure (registered trademark) 369 (2-benzyl-2-dimethylamino-1-(4-morpholinophenyl)butanone-1), Irgacure (registered trademark) 379 (EG) (2-dimethylamino-2-(4-methylbenzyl)-1-(4-morpholin-4-ylphenyl)butane-1-one, and Irgacure (registered trademark) 907 (2-methyl-1-[4-methylthiophenyl]-2-morpholinopropane-1-one, all commercially available from Ciba.

The acylphosphine oxide-based compound is preferably exemplified by Irgacure (registered trademark) 819 (bis(2,4,6-trimethylbenzoyl)phenylphosphine oxide, Irgacure (registered trademark) 1800 (bis(2,6-dimethoxybenzoyl)-2,4,4-trimethyl-pentylphosphine oxide, all commercially available from BASF GmbH, Lucirin TPO (2,4,6-trimethylbenzoyl-diphenylphosphine oxide), and Lucirin TPO-L (2,4,6-trimethylbenzoylphenylethoxyphosphine oxide), again all commercially available from Ciba.

The oxime ester-based compound is preferably exemplified by Irgacure (registered trademark) OXE01 (1,2-octanedione,1-[4-(phenylthio)phenyl]-2-(O-benzoyloxime), Irgacure (registered trademark) OXE02 (ethanone, 1-[9-ethyl-6-(2-methylbenzoyl)-9H-carbazole-3-yl]-, 1-(O-acetyloxime), all commercially available from Ciba.

The cationic photo-polymerization initiator used in the present invention is preferably sulfonium salt compound, iodonium salt compound, or oxim sulfonate compound, which is exemplified by 4-methylphenyl-[4-(1-methylethyl) phenyliodonium tetrakis(pentafluorophenyl) borate (PI2074, from Rhodia), 4-methylphenyl-[4-(2-methylpropyl)phenyliodonium hexafluorophosphate (Irgacure 250, from Ciba), Irgacure PAG103, 108, 121 and 203 (from Ciba).

The photo-polymerization initiator used in the present invention need be appropriately selected depending on wavelength of a light source to be used, and is preferably a product which does not emit gas during pressurizing under the mold and light exposure. Since the emitted gas will contaminate the mold, so that the mold need be cleaned up frequently, or the photo-curable composition will deform in the mold, to thereby degrade the accuracy of transferred pattern.

The curable composition for imprint of the present invention is preferably configured as a radical polymerizable curable composition, in which the (A) polymerizable monomer is a radical polymerizable monomer, and the (B) photo-polymerization initiator is a radical polymerization initiator capable of producing a radical upon being irradiated with light.

(C) Polar Group-Containing Non-Polymerizable Compound

The curable composition for imprint of the present invention preferably contains (C) polar group-containing non-polymerizable compound. In the present invention, it is particularly preferable that the (C) polar group-containing non-polymerizable compound is a hydroxy group-containing polymer. As a result of inclusion of such compound, the pattern chipping in the cured region may more effectively be suppressed. This is supposedly because the cured region becomes more likely to retain moisture in the process of curing of the curable composition for imprint, and thereby the moisture is suppressed from condensing and from forming droplets. The effect is distinctive particularly when the (C) polar group-containing non-polymerizable compound contains hydroxy group(s).

Polar group owned by the (C) polar group-containing non-polymerizable compound is exemplified, without special limitation, by compounds having alcoholic hydroxy group, phenolic hydroxy group, carboxy group, carbonyl group, sulfo group, amino group, sulfonamide group, sulfonylimide group, (alkylsulfonyl) (alkylcarbonyl) methylene group, (alkylsulfonyl) (alkylcarbonyl) imide group, bis(alkylcarbonyl) methylene group, bis(alkylcarbonyl) imide group, bis(alkylsulfonyl) methylene group, bis(alkylsulfonyl) imide group, tris(alkylcarbonyl) methylene group, and tris(alkylsulfonyl) methylene group. If the (C) polar group-containing non-polymerizable compound is a polymer, the polar group may be contained in any of the main chain, side chain, and terminal structure.

The (C) polar group-containing non-polymerizable compound is exemplified by polymers such as polypropylene glycol, poly(2-hydroxyethyl methacrylate), polymethacrylic acid, and polyhydroxystyrene; ketones such as 2-butanone, 3-methylbutanone, pinacolone, 2-pentanone, 3-pentanone, 3-methyl-2-pentanone, acetone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, diisobutyl ketone, phenylacetone, methyl naphthyl ketone, acetyl acetone, acetonyl acetone, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone isophorone; alkylene carbonates such as ethylene carbonate, butylene carbonate, and propylene carbonate; alcohols such as methanol, ethanol, n-propanol, isopropanol, n-butanol, s-butanol, tert-butanol, isobutanol, n-hexanol, n-heptanol, n-octanol, n-decanol, 4-methyl-2-pentanol, ethylene glycol, diethylene glycol, triethylene glycol, methyl lactate, ethyl lactate, propyl lactate, butyl lactate, ethylene glycol monomethyl ether, propylene glycol monomethyl ether, ethylene glycol monoethyl ether, propylene glycol monoethyl ether, propylene glycol monopropyl ether, propylene glycol monobutyl ether, diethylene glycol monomethyl ether, triethylene glycol monoethyl ether, and methoxymethyl butanol; cyclic ethers such as dioxane and tetrahydrofuran; amides such as N-methyl-2-pyrrolidone, N,N-dimethylacetamide, N,N-dimethylformamide, hexamethylphosphoric triamide, and 1,3-dimethyl-2-imidazolidinone; and mixtures of them.

Content of the (C) polar group-containing non-polymerizable compound in the curable composition for imprint of the present invention is preferably 0.01 to 10% by mass of the solid content, and more preferably 0.1 to 5% by mass.

(D) Nonpolar Solvent

The curable composition for imprint of the present invention may further contain nonpolar solvent (D). As a result of inclusion of the solvent in the curable composition for imprint of the present invention, it now becomes possible to control viscosity of the curable composition for imprint.

The nonpolar solvent (D) usable in the present invention is exemplified by esters such as methyl acetate, butyl acetate, ethyl acetate, isopropyl acetate, amyl acetate, propylene glycol monomethyl ether acetate, propylene glycol monoethyl ether acetate, propylene glycol monopropyl ether acetate, propylene glycol monobutyl ether acetate, ethylene glycol monoethyl ether acetate, ethylene glycol monomethyl ether acetate, diethylene glycol monobutyl ether acetate, diethylene glycol monoethyl ether acetate, 3-methoxybutyl acetate, 3-methyl-3-methoxybutyl acetate, propylene glycol monomethyl ether propionate, propylene glycol monoethyl ether propionate, methyl 3-methoxypropinate, methyl 3-ethoxypropionate, ethyl 3-methoxypropionate, ethyl 3-ethoxypropionate, methyl formate, ethyl formate, butyl formate, and propyl formate; lactones such as β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone; ethers such as dibutyl ether, diisopentyl ether, and anisole; aromatic hydrocarbons such as toluene and xylene; aliphatic hydrocarbons such as pentane, hexane, octane, decane, cyclopentane, and cyclohexane; and mixtures of them.

The nonpolar solvent (D) may be added to the curable composition for imprint of the present invention, to as much as 99% by mass or less of the total composition, generally to as much as 30% by mass Or less, preferably to as much as 20% by mass or less, and particularly to as much as 10% by mass or less. It is, however, preferable for the curable composition for imprint of the present invention to contain substantially no solvent. "To contain substantially no solvent" herein means that the content of the nonpolar solvent (D) is typically 3% by mass or less, and more typically 1% by mass or less.

(Other Components)

The curable composition for imprint of the present invention may contain, besides the components described above, any other components such as surfactant, and antioxidant, depending on various purposes, so long as the effects of the present invention will not be impaired.

-Surfactant-

The curable composition for imprint of the present invention preferably contains a surfactant. Content of the surfactant used in the present invention is typically 0.001 to 5% by mass of the total composition excluding the solvent, preferably 0.002 to 4% by mass, and furthermore preferably 0.005 to 3% by mass. If two or more species of surfactants are used, the total content falls in the above-described ranges. If the content of the surfactant falls in the range from 0.001 to 5% by mass of the composition, an effect of improving uniformity of coating will be good, and mold transfer property will become less likely to degrade since the surfactant is not excessive.

The surfactant is preferably a nonionic surfactant. The surfactant preferably contains at least one species selected from fluorine-containing surfactant, silicon-containing surfactant (preferably, silicone-based surfactant) and fluorine/silicon-containing surfactant (preferably, fluorine-containing, silicone-based surfactant), more preferably contains both of the fluorine-containing surfactant and the silicon-containing surfactant (preferably, silicone-based surfactant), or fluorine-containing, silicone-based surfactant, and most preferably contains the fluorine/silicon-containing surfactant (preferably, fluorine-containing, silicone-based surfactant). The fluorine-containing surfactant and silicone-based surfactant are preferably nonionic surfactants.

The "fluorine/silicon-containing surfactant" herein means a surfactant which satisfies requirements of both of fluorine-containing surfactant and silicon-containing surfactant.

By using such surfactant, it now becomes possible to solve coating failures such as striation or scale pattern (non-uniform drying of resist film), which may be produced when the curable composition for imprint of the present invention is coated over a silicon wafer for manufacturing semiconductor element, square glass panel for manufacturing liquid crystal element, or over a substrate on which various films such as chromium film, molybdenum film, molybdenum alloy film, tantalum film, tantalum alloy film, silicon nitride film, amorphous silicon film, tin oxide-doped indium oxide (ITO) film or tin oxide film is formed. It also becomes possible to improve flowability of the curable composition for imprint of the present invention into recess or cavity of mold, to improve separability between the mold and the resist, to improve adherence between the resist and the substrate, and to reduce viscosity of the composition. In particular, the curable composition for imprint of the present invention may largely be improved in the uniformity of coating, as a result of addition of the surfactant, and may achieve a good coating performance irrespective of the size of substrate, when coated using a spin coater or slit scan coater.

The nonionic fluorine-containing surfactant used in the present invention is exemplified by Fluorad FC-430, FC-431 (trade names, from Sumitomo 3M Ltd.), Surflon "S-382" (trade name, from Asahi Glass Co., Ltd.), Eftop "EF-122A, 122B, 122C, EF-121, EF-126, EF-127, MF-100" (trade names, from Tohkem Products Corporation), PF-636, PF-6320, PF-656, PF-6520 (trade names, all Omnova Solutions Inc.), Ftergent FT250, FT251, DFX18 (trade names, all from NEOS Co., Ltd.), Unidyne DS-401, DS-403, DS-451 (trade names, all from Daikin Industries, Ltd.), and Megafac 171, 172, 173, 178K, 178A (trade names, all from DIC Corporation); meanwhile the nonionic silicon-containing surfactant is exemplified by SI-10 Series (trade name, from Takemoto Oil&Fat Co., Ltd.), Megafac Paintad 31 (from DIC Corporation), and KP-341 (from Shin-Etsu Chemical Co., Ltd.).

The fluorine-containing, silicone-based surfactant used in the present invention is exemplified by X-70-090, X-70-091, X-70-092, X-70-093 (trade names, all from Shin-Etsu Chemical Co., Ltd.) and Megafac R-08, XRB-4 (trade names, all from DIC Corporation).

-Antioxidant-

Preferably, the curable composition for imprints used in the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by BASF GmbH); Antigene P, 3C, FR, Sumilizer S, Sumilizer GA80 (by Sumitomo Chemical); Adekastab A070, A080, A0503 (by Adeka), etc. These may be used either singly or as combined.

-Polymerization Inhibitor-

Furthermore, the curable composition for imprints used in the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added in the process of preparing the polymerizable monomer, or may be added later to the curable composition. Examples of preferable polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylene bis(4-methyl-6-tert-butylphenol), N-nitrosophenylhydroxyamine serous salt, phenothiazine, phenoxazine, 4-methoxynaphthol, 2,2,6,6-tetramethylpiperidine-1-oxyl free radical, 2,2,6,6-tetramethylpiperidine, 4-hydroxy-2,2,6,6-tetramethylpiperidine-1-oxyl free radical, nitrobenzene, and dimethylaniline, and preferably p-benzoquinone, 2,2,6,6-tetramethylpiperidine-1-oxyl free radical, 4-hydroxy-2,2,6,6-tetramethylpiperidine-1-oxyl free radical, and phenothiazine. These polymerization inhibitors may suppress polymer impurities from generating, not only in the process of preparing the polymerizable monomer, but also during storage of the curable composition, to thereby suppress degradation in the pattern formability in imprinting.

The curable composition for imprints of the present invention may optionally be added with, besides the components described above, mold releasing agent, silane coupling agent, UV absorber, photo-stabilizer, anti-aging agent, plasticizer, adherence promoter, heat polymerization initiator, colorant, elastomer particle, photo acid amplifier, photo base generator, basic compound, fluidity modifier, defoaming agent, dispersion aid or the like.

Viscosity of the curable composition for imprints of the present invention at 23° C. is preferably 5 to 30 mPa·s, and more preferably 7 to 20 mPa·s.

The curable composition for imprints of the present invention is prepared by mixing the individual components, preferably under a low humidity atmosphere. More specifically, the humidity at 23° C. is preferably 30% or below, more preferably 5 to 25%, and furthermore preferably 10 to 20%. The composition is preferably prepared at low temperatures, preferably under an atmosphere at 30° C. or below, and more preferably prepared under an atmosphere at 15 to 25° C. It is difficult to distill or purify the curable composition for imprints of the present invention after prepared. This is because the curable composition for imprints will solidify by a reaction under heating, and because it generally has a large viscosity. It is therefore preferable to prepare the curable composition for imprints, while paying attention to avoid moisture absorption in the process of preparation.

The curable composition for imprints of the present invention, after prepared, is preferably allowed to pass through a filter. The filter used herein preferably has an effective filtering area of 200 cm$^2$ or larger. The filtration is preferably conducted under the same humidity and temperature as those in the process of preparation of the curable composition for imprints. The effective filtering area of the filter is preferably 300 cm$^2$ or larger, more preferably 500 cm$^2$ or larger, and furthermore preferably 1,000 cm$^2$ or larger.

Note that the effective filtering area in the present invention means the area over which particles, incapable of passing through the filter, can deposit out of the entire portion of the filter brought into contact with liquid during filtration. This generally represents the surface area of the filter used for filtration.

Although not specifically limited, preferable systems for allowing the curable composition for imprints to pass through the filter plural times are exemplified by a system of circulating the composition in a device equipped with a filter; a system of allowing the composition to pass once or more, through every one of a plurality of filters connected in series; a system of conducting filtration followed by another filtration through the same or different filters; and a system based on a combination of them.

In the system of allowing the composition to pass through the filters twice of more, every succeeding filter preferably has a pore size smaller than that of the preceding filter. With this configuration, lift-off of the pattern tends to be suppressed more effectively.

While the pressure to be applied during passage through the filter in the filtration process may vary depending on materials composing the filter and filtration device, chemical structure of the curable composition and so forth, it is preferably 0.5 MPa or below. With the pressure adjusted in this range, particles in association with impurities are more effectively prevented from passing through the filter.

The pressure to be applied is more preferably 0.05 MPa to 0.3 MPa, and furthermore preferably 0.05 MPa to 0.1 MPa.

In the present invention, the average flow rate of the curable composition for imprints is preferably 0.01 L/min or larger, and more preferably 0.05 L/min to 3.0 L/min.

Among the filters used in the present invention, at least one of them preferably has a pore size of 0.1 μm or smaller. It is more preferable that all filters have a pore size of 0.1 μm or smaller.

The pore size is more preferably 0.05 μm or smaller, and furthermore preferably 0.005 to 0.05 μm. By the passage through the filters with such pore sizes, submicron particles or foreign matters may be eliminated.

While filter materials used in the present invention are not specifically limited, at least one of them is preferably composed of polypropylene-based resin, fluorine-containing resin, polyethylene-based resin, nylon-based resin or the like. From the viewpoint of performance of eliminating foreign matters and temporal stability of the filter, it is particularly preferable that at least one of them is fluorine-containing resin-based filter or polyethylene-based filter.

At least one of the filters used in the present invention is preferably a filter cartridge composed of a pleated membrane filter. The filter cartridge composed of a pleated membrane filter is advantageous for its large effective area achieved in the manufacturing process.

Next, a method of storing the curable composition for imprints of the present invention will be described. The curable composition for imprints of the present invention is generally sealed in an air-tight storage container. In the present invention, the ratio of filling of the curable composition for imprints, at the time of loading into the storage container, is preferably 30% by volume or more, and more preferably 40% by volume or more. The ratio of filling herein means the ratio of the volume of the curable composition for imprints (% by volume) relative to the internal volume of the container. The internal volume means capacity available for actually enclosing the curable composition for imprints. Accordingly, for the case where the space in the container available for enclosing the curable composition for imprints was reduced, typically by placing therein a solid or the like nonreactive with the curable composition for imprints, the volume of thus reduced space is now understood as the internal volume.

Storage temperature is preferably 10° C. or below, and more preferably 0 to 10° C. By the storage at such temperature, the curable composition is now made less reactive.

Humidity is preferably 30% or below, and more preferably 20% or below.

By storing the curable composition for imprints of the present invention according to such method, a part of the curable composition for imprints stored in the storage container may be taken out for pattern formation, and the residual may be stored also thereafter. The curable composition for imprints, remained unused after the pattern formation, is more preferably stored according to the storage method described above. More specifically, also the curable composition for imprints remained unused after the pattern formation is preferably stored, while controlling the ratio of filling, at the time of loading of the curable composition for imprints into the storage container to 30% by volume or more.

In the pattern formation using the curable composition for imprints having been stored, the curable composition for imprints is preferably brought back to room temperature (20 to 30° C., for example), and then subjected to the pattern formation. An operation for bringing the composition back to room temperature preferably takes 12 hours to one day.

While not specifically limited, size of the storage container is preferably 10 mL to 10 L, and more preferably 50 mL to 5 L.

The storage container preferably has a light transmittance of 1% or below, in the wavelength range from 250 to 440 nm.

The curable composition for imprints of the present invention is capable of forming a fine pattern by photo-nanoimprinting at low cost and high accuracy. Accordingly, the pattern having been formed by the conventional photo-lithographic technique, will now be formed with still higher accuracy and at lower cost. For example, by applying the composition of the present invention on a substrate or Support, and by subjecting a layer composed of the composition to light exposure, curing and optional drying, the composition is now also adoptable to a permanent film such as overcoat layer, insulating film and so forth typically used for liquid crystal display device (LCD), or to an etching resist used for manufacturing semiconductor integrated circuit, recording medium, flat panel display device and so forth.

For the resist used for permanent film (resist for composing structural members) in the liquid crystal display devices (LCD) and so forth, and for the resist used for patterning the substrate of electronic materials, it is preferable to avoid as possible contamination of ionic impurities such as metal or organic substances, so as not to inhibit operations of the products. For this purpose, the concentration of ionic impurities such as metal or organic substances, in the curable composition for imprints of the present invention, is 1,000 ppm or below, preferably 10 ppm or below, and furthermore preferably 100 ppb or below.

Next, a method of forming a pattern (in particular, fine irregularity pattern) using the curable composition for imprints of the present invention will be explained. According to the pattern forming method of the present invention, the fine irregular pattern may be formed by implementing the steps of placing the curable composition for imprints of the present invention onto a substrate, to thereby form a pattern-forming layer; pressing a mold onto the surface of the pattern-forming layer; and irradiating light onto the pattern-forming layer, to thereby cure the composition of the present invention.

It is now preferable that the curable composition for imprints of the present invention is cured by further heating it after the photo-irradiation. More specifically, the pattern-forming layer composed of at least the composition of the present invention is placed on the substrate (base or support), and is dried as necessary so as to form a layer (pattern-forming layer) composed of the composition of the present invention, to thereby manufacture a pattern acceptor (the substrate having the pattern-forming layer provided thereon), the mold is pressed onto the surface of the pattern-forming layer of the pattern acceptor, the mold pattern is transferred, and the layer for forming the fine irregularity pattern is cured by photo-irradiation. The photoimprinting lithography according to the pattern forming method of the present invention can afford stacking or multiple patterning, and also may be used in combination with the general thermal imprinting.

The paragraphs below will specifically describe a method of forming a pattern using the curable composition for imprint of the present invention (pattern transferring method).

In the method of forming a pattern of the present invention, first, the composition of the present invention is applied over the substrate to thereby form a pattern-forming layer.

A method of applying the curable composition for imprint of the present invention over the substrate is any of methods well known to the public, such as dip coating, air knife coating, curtain coating, wire bar coating, gravure coating, extrusion coating, spin coating, slit scanning, or ink jet process, by which a coated film or liquid droplets are applied to the substrate. Among them, the curable composition for imprint obtained by the method of manufacturing of the present invention is suitable for ink jet process.

The pattern-forming layer composed of the composition of the present invention has a thickness of 0.01 to 1 μm or around, although variable depending on purposes of use. The composition of the present invention may be applied by multi-coating. Furthermore, other organic layer such as a planarizing layer or the like may be formed between the substrate and the pattern-forming layer composed of the composition of the present invention. With this configuration, the pattern-forming layer is kept away from direct contact with the substrate, and thereby the substrate may be prevented from adsorbing dust or being damaged. Note that the pattern formed by the composition of the present invention keeps a good adherence with the organic layer, even if the organic layer is provided on the substrate.

The substrate (substrate or support) on which the curable composition for imprint of the present invention is applied is selectable, depending on various applications without special limitation, from quartz; glass; optical film; ceramic materials; evaporated film; magnetic film; reflective film; metal substrates composed of Ni, Cu, Cr, Fe and so forth; paper; SOG (Spin On Glass); polymer substrates such as polyester film, polycarbonate film and polyimide film; TFT array substrate; electrode panel of PDP; glass and translucent plastic substrates; electroconductive substrates composed of ITO, metals and so forth; insulating substrate; and semiconductor manufacturing substrate composed of silicon, silicon nitride, polysilicon, silicon oxide or amorphous silicon. Geometry of the substrate may be plate or roll, again without special limitation. As described later, the substrate is selectable from those with translucency and non-translucency, depending on combination with the mold.

Next, in the pattern forming method of the present invention, the mold is pressed onto the surface of the pattern-forming layer, in order to transfer the pattern to the pattern-forming layer. In this way, a fine pattern preliminarily formed on the surface to be pressed of the mold may be transferred to the pattern-forming layer.

Alternatively, the composition of the present invention may be coated on the mold having the pattern formed thereon, and the substrate may be pressed thereto.

The mold material usable in the invention is described. In the photoimprint lithography with the composition for imprints of the invention, a light-transmissive material is selected for at least one of the mold material and/or the substrate. In the photoimprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for photoimprints is applied onto a light-transmissive substrate, then a mold is pressed against it, and this is irradiated with light from the back of the substrate whereby the curable composition for photoimprints can be cured.

The photoirradiation may be attained while the mold is kept in contact with the layer or after the mold is released. In the invention, preferably, the photoirradiation is attained while the mold is kept in contact with the patterning layer.

The mold usable in the present invention is a mold having formed thereon a pattern to be transferred. The pattern on the mold may be formed for example by photolithography, electron beam lithography or the like, depending on a desired level of process accuracy. In the present invention, methods of forming the mold pattern are not specifically limited.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the invention may be processed for surface release treatment for the purpose of enhancing the releasability of the curable composition for imprints from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photoimprint lithography with the curable composition for imprints, in general, the mold pressure in the patterning method of the invention is preferably at most atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for imprints in the area of mold pattern projections may be reduced.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition for imprints and on the tackiness of the cured film as previously determined.

In the imprint lithography applied to the present invention, photo-irradiation is conducted while keeping the substrate temperature generally at room temperature, wherein the photo-irradiation may alternatively be conducted under heating for the purpose of enhancing the reactivity. Also photo-irradiation in vacuo is preferable, since a vacuum conditioning prior to the photo-irradiation is effective for preventing entrainment of bubbles, suppressing the reactivity from being reduced due to incorporation of oxygen, and for improving the adhesiveness between the mold and the curable composition for imprints. In the method of forming a pattern according to the present invention, the degree of vacuum in the process of photo-irradiation is preferably in the range from $10^{-1}$ Pa to normal pressure.

Light to be used for photoirradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, LED, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer (a layer comprising the curable composition for imprints layer) is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

[Pattern]

The pattern thus formed by the method of forming a pattern according to the present invention is usable as a permanent film (resist for composing structural members) directed to use in liquid crystal display (LCD) devices, or as an etching resist. The permanent film, after manufactured, is transported or stored while being bottled in containers such as gallon bottles or coated bottles. The inside of the containers may be replaced with inert nitrogen or argon, for the purpose of preventing degradation. While the permanent film may be transported or stored at normal temperature, the temperature may alternatively be controlled in the range from −20° C. to 0° C., in order to prevent the permanent film from being denatured. Of course, the permanent film is preferably shielded from light to a degree enough to suppress the reaction.

The pattern formed by using the curable composition for imprint of the present invention is also excellent in solvent resistance. While the curable composition for imprint of the present invention is preferably durable against a wide variety of solvents, it is particularly preferable that the pattern will not change in thickness even after immersed for 10 minutes in a solvent generally used for manufacturing substrate, such as N-methylpyrrolidone at 23° C.

The pattern formed by the method of forming a pattern of the present invention is also usable as an etching resist. When the curable composition for imprint of the present invention is used as an etching resist, first, for example a silicon wafer having formed thereon a thin film of SiO$_2$ or the like is used as the substrate, and then on the substrate, a nanometer-order fine pattern is formed by the method of forming a pattern according to the present invention. Etching is then conducted using hydrofluoric acid for wet etching, or an etching gas such as CF$_4$ for dry etching, to thereby form a desired pattern on the substrate. The curable composition for imprint of the present invention preferably demonstrate a good etching resistance in the dry etching using fluorocarbon or the like.

EXAMPLE

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

Materials described below were used in this embodiment.
(A1) Polymerizable Monomer: Synthesis of m-Xylylene Diacrylate To 1,000 ml of distilled water, 411 g of sodium hydroxide was added, and therein 781 g of acrylic acid was dropped under cooling on ice. The mixture was further added with 107 g of benzyltributylammonium chloride and 600 g of α,α'-dichloro-meta-xylene, and allowed to react at 85° C. for 7 hours. The reaction liquid was added with 1,600 ml of ethyl acetate, the organic layer was successively washed with a 1% aqueous hydrochloric acid solution, a 1% aqueous tetramethylammonium hydroxide solution, and distilled water, the organic layer was added with 0.01 g of p-benzoquinone as a polymerization inhibitor, and the organic layer was concentrated in vacuo until the solvent content is reduced down to 1% by mass or below, to thereby obtain a polymerizable monomer (A1).

(A2) Synthesis of Polymerizable Monomer: Synthesis of 2-Naphthylmethyl Acrylate

Under nitrogen gas flow, 600 g of 2-methylnaphthalene was dissolved into 6,000 ml of ethyl acetate, the mixture was then added with 422 g of 1,3-dibromo-5,5-dimethylhydantoin, and heated to 40° C. The mixture was added with 7.4 g of V-65 from Wako Pure Chemical Industries, Ltd., and allowed to react at 40° C. for 7 hours. Thereafter, the reaction liquid was allowed to react at 65° C. for 3 hours, and then cooled. The reaction liquid was successively washed with aqueous sodium hydrogen carbonate solution and distilled water, and then concentrated. The concentrate was added with 3,600 ml of isopropanol, stirred for 30 minutes, added with 900 ml of distilled water, and further stirred for 30 minutes. Precipitated solid was collected by filtration, added with 1,800 ml of isopropanol, the mixture was stirred for 30 minutes, added with 450 ml of distilled water, and further stirred for 30 minutes. The resultant solid was collected by filtration, and dried, to thereby obtain 300 g of 2-bromomethylnaphthalene.

To 200 ml of distilled water, 81.4 g of sodium hydroxide was added, and therein 147 g of acrylic acid was dropped under cooling on ice. The mixture was added with 42.4 g of benzyltributylammonium chloride and 300 g of 2-bromomethylnaphtnalene, and then allowed to react at 75° C. for 2 hours. The reaction liquid was added with 800 ml of ethyl acetate/hexane=2/8 (ratio by volume), the organic layer was successively washed with a 1% aqueous hydrochloric acid solution, a 1% aqueous tetramethylammonium hydroxide solution and distilled water, the organic layer was added with 0.01 g of p-benzoquinone as a polymerization inhibitor, the organic layer was concentrated in vacuo until the solvent content is reduced down to 1% by mass or below, to thereby obtain a polymerizable monomer (A2).

A3: isoboronyl acrylate (IBXA, from Osaka Organic Chemical Industry, Ltd.)

A'1: perfluorohexylethyl acrylate (from Kanto Chemical Co., Inc.)

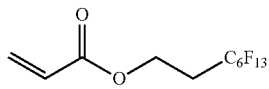

A'2: Synthesized according to a method described in JP-A-2010-239121

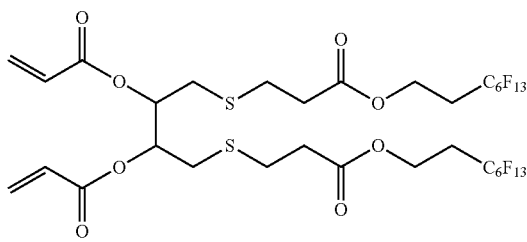

(B) Polymerization Initiator
(B1) Photo-polymerization initiator: Irgacure 379EG (from BASF)
(B2) Photo-polymerization initiator: Darocur 1173 (from BASF)
(C) Polar group-containing, non-polymerizable compound
C1: Polypropylene glycol: 161-17635, from Wako Pure Chemical Industries, Ltd.
C2: Ethylene glycol: 055-00996, from Wako Pure Chemical Industries, Ltd.
C3: Poly(2-hydroxyethyl methacrylate)
A monomer corresponded to the repeating unit is dissolved in PGMEA, to thereby prepare 450 g of a solution with a solid concentration of 15% by mass. To this solution, 1 mol % of polymerization initiator V-601 from Wako Pure Chemical Industries, Ltd. was added, and the mixture was dropped into 50 g of PGMEA heated to 100° C., under a nitrogen atmosphere, over 6 hours. Upon completion of the dropping, the reaction liquid was further stirred for 2 hours. Upon completion of the reaction, the reaction liquid was cooled to room temperature, crystallized in 5 L of methanol, and a deposited white powder was collected by filtration, to thereby recover resin C3 as an objective substance. The weight average molecular weight, determined by GPC calibrated with polystyrene standards, was found to be 3,000 with a variance of 2.0.
C4: Polymethacrylic acid: 551-77711, from Wako Pure Chemical Industries, Ltd.
C5: Polyhydroxystyrene C5 was synthesized in the same way with the above-described C3, except that a monomer corresponded to the repeating unit was used. The weight average molecular weight, determined by GPC calibrated with polystyrene standards, was found to be 5,000 with a variance of 1.8.
C6: Polyethylene glycol: 165-09085 from Wako Pure Chemical Industries, Ltd.

Preparation of Curable Composition for Imprints

The individual components were mixed according to the ratio of mixing shown in the Table below, to prepare the curable compositions for imprint. Water was added in some of Examples and Comparative Examples, so as to adjust the moisture content as listed in the Table. The preparation was conducted at room temperature (23° C.), under the environmental humidity listed in the Table. The pure water used herein was prepared using a water purifier Milli-Q Jr., from Millipore Corporation, and was found to have a resistivity of 18.3 MΩ·cm. Optimizer D 300 filters (ultra-high molecular weight polyethylene filters, from Nihon Entegris K.K.) with pore sizes of 0.1 μm and 0.02 μm were connected in series, through which the obtained liquid was allowed to pass twice. Pressure applied in this process was controlled so as to adjust the flow rate to 0.05 L/min.

Storage of Curable Composition for Imprints

Each of the thus obtained curable compositions for imprint was loaded into a storage container having a capacity listed in the Table, so as to adjust the ratio of filling to any of the values listed in the Table, and sealed. The compositions were sealed at 1° C. for 8 hours, and then allowed to stand, while keeping them enclosed or after unsealed as listed in the Table, at room temperature (23° C.) for 8 hours. These operations were repeated the number of times listed in the Table below. The moisture content listed in the Table indicates the moisture content measured after storage.

The moisture content of the obtained curable compositions for imprint was measured by the Karl Fischer method.

<Pattern Chipping>

A film of each of the curable compositions described above was formed over a 8-inch silicon substrate by an ink jet process, and placed thereon was a mold having a pattern with 40 nm wide line/space (1/1) and 80 nm deep grooves, and having the surface coated with a perfluoropolyether-based silane coupling agent (Optool HD1100, from Daikin Industries, Ltd.) for better mold releasing. While keeping the mold pressed against the composition under a pressure of 1 MPa under a nitrogen gas flow, the composition was allowed to cure under illumination with light of 365 nm using a mercury lamp, with a photo exposure of 10 mW/cm², and a luminous exposure of 200 mJ/cm². After the curing, the mold was slowly separated. The obtained pattern was observed under a scanning electron microscope, and chipping in the cured pattern was evaluated as follows. The evaluation was repeated 20 times in a row. With respect to the level for which evaluation could be repeated 20 times in a row, the pattern chipping was ranked into five levels from A to F, and the numbers of substrates in the individual examples was comparatively shown in the Table below.

A: No pattern chipping observed;
B: Area with observable pattern chipping was less than 1% of pattern-forming area;
C: Area with observable pattern chipping was 1% or more and less than 3% of pattern-forming area;
D: Area with observable pattern chipping was 3% or more and less than 10% of pattern-forming area;
E: Area with observable pattern chipping was 10% or more and less than 20% of pattern-forming area; and
F: Area with observable pattern chipping was 20% or more of pattern-forming area.

TABLE 1

| | Curable compound (A) | Amount of addition (% by mass) | Polymerizable monomer having fluorine atoms (A') | Amount of addition (% by mass) | Polymerization initiator (B) | Amount of addition (% by mass) | Compound (C) | Amount of addition (% by mass) | Addition of pure water | Capacity of the storage container | Ratio of filling of the storage container | Cold stage-back to room temperature (Condition, Repeated the number) | Environmental humidity | Moisture content | Viscosity | Pattern chipping (First try/Tenth try) |
|---|---|---|---|---|---|---|---|---|---|---|---|---|---|---|---|---|
| Example 1 | A1 | 97 | A1 | 1 | B1 | 2 | — | — | — | 1000 mL | 52% | Opened, 1 | 53 | 0.75 | 11.0 | C/C |
| Example 2 | A1 | 97 | A1 | 1 | B1 | 2 | — | — | — | 1000 mL | 91% | Sealed, 1 | 53 | 0.16 | 10.8 | A/A |
| Example 3 | A1 | 97 | A1 | 1 | B1 | 2 | — | — | — | 1000 mL | 76% | Sealed, 1 | 53 | 0.34 | 10.9 | A/A |
| Example 4 | A1 | 97 | A1 | 1 | B1 | 2 | — | — | — | 1000 mL | 49% | Sealed, 1 | 53 | 0.41 | 10.9 | A/B |
| Example 5 | A1 | 97 | A1 | 1 | B1 | 2 | — | — | Addition of water | 1000 mL | 61% | Sealed, 1 | 53 | 0.66 | 11.1 | C/C |
| Example 6 | A1 | 96 | A2 | 1 | B1 | 3 | — | — | — | 1000 mL | 32% | Sealed, 5 | 53 | 0.51 | 10.6 | B/B |
| Example 7 | A1 | 94 | A2 | 1 | B1 | 3 | C1 | 2 | — | 1000 mL | 93% | Sealed, 1 | 28 | 0.06 | 11.3 | A/A |
| Example 8 | A1 | 93 | A2 | 2 | B1 | 4 | C1 | 2 | — | 1000 mL | 88% | Sealed, 1 | 53 | 0.16 | 11.2 | A/A |
| Example 9 | A1 | 93 | A2 | 2 | B1 | 4 | C1 | 1 | — | 1000 mL | 62% | Sealed, 1 | 53 | 0.34 | 10.8 | A/A |
| Example 10 | A1 | 94 | A2 | 2 | B2 | 3 | C1 | 1 | — | 1000 mL | 43% | Sealed, 1 | 53 | 0.45 | 11.0 | A/B |
| Example 11 | A1 | 90 | A2 | 3 | B1 | 3 | C1 | 4 | Addition of water | 1000 mL | 57% | Sealed, 1 | 53 | 0.70 | 10.9 | B/C |
| Example 12 | A1/A2 | 47/47 | A1 | 3 | B1 | 2 | C2 | 2 | — | 1000 mL | 69% | Opened, 3 | 53 | 0.68 | 13.2 | C/C |
| Example 13 | A1/A2 | 47/47 | A2 | 2 | B1 | 2 | C2 | 2 | — | 100 mL | 55% | Sealed, 20 | 53 | 0.42 | 13.6 | A/B |
| Example 14 | A1/A2 | 48/48 | A1 | 2 | B1 | 2 | — | — | — | 100 mL | 40% | Sealed, 1 | 28 | 0.29 | 13.0 | A/B |
| Example 15 | A3 | 95 | A1 | 1 | B1 | 2 | C1 | 2 | — | 1000 mL | 90% | Sealed, 1 | 32 | 0.11 | 9.8 | A/A |
| Example 16 | A3 | 94 | A1 | 1 | B1 | 3 | C2 | 2 | — | 1000 mL | 45% | Sealed, 1 | 53 | 0.40 | 9.5 | A/B |
| Example 17 | A3 | 95 | A1 | 1 | B1 | 2 | C3 | 2 | — | 1000 mL | 66% | Sealed, 1 | 53 | 0.38 | 9.4 | A/A |
| Example 18 | A3 | 95 | A1 | 1 | B1 | 2 | C4 | 2 | — | 1000 mL | 39% | Sealed, 1 | 53 | 0.51 | 10.1 | B/B |
| Example 19 | A3 | 95 | A1 | 1 | B1 | 2 | C5 | 2 | — | 1000 mL | 27% | Sealed, 1 | 53 | 0.76 | 9.7 | B/C |
| Example 20 | A3 | 96 | A2 | 1 | B1 | 3 | — | — | Addition of water | 1000 mL | 76% | Sealed, 2 | 53 | 0.65 | 9.3 | C/C |
| Example 21 | A3 | 96 | A2 | 2 | B1 | 2 | — | — | — | 1000 mL | 59% | Sealed, 6 | 53 | 0.48 | 9.6 | A/B |
| Example 22 | A1 | 96 | — | — | B1 | 2 | C6 | 2 | — | 1000 mL | 73% | Opened, 5 | 53 | 0.60 | 11.1 | C/C |
| Example 23 | A3 | 96 | A1 | 1 | B1 | 3 | C2 | 2 | — | 1000 mL | 45% | Sealed, 1 | 53 | 0.40 | 9.5 | B/C |
| Comparative example 1 | A1/A2 | 96 | — | — | B1 | 2 | — | — | — | 1000 mL | 66% | Opened, 7 | 53 | 0.83 | 12.9 | D/E |
| Comparative example 2 | A3 | 95 | A1 | 2 | B1 | 3 | — | — | — | 1000 mL | 82% | Opened, 9 | 53 | 0.90 | 10.1 | E/E |
| Comparative example 3 | A1 | 95 | A2 | 2 | B1 | 3 | — | — | Addition of water | 1000 mL | 33% | Sealed, 1 | 28 | 1.03 | 11.4 | E/F |
| Comparative example 4 | A1/A2 | 91 | A2 | 2 | B1 | 4 | C3 | 3 | Addition of water | 1000 mL | 90% | Sealed, 10 | 53 | 1.51 | 13.0 | F/F |
| Comparative example 5 | A1 | 97 | A1 | 1 | B1 | 2 | — | — | Addition of water | 1000 mL | 91% | Sealed, 1 | 53 | 0.88 | 10.8 | D/E |

In the Table above, the environmental humidity means relative humidity measured using a desktop thermo-hygrometer 608-H1 (from testo K.K.), expressed in percentage. The viscosity is given by values at 23° C. in mPa·s.

The ratio of filling of the storage container is given by (volume of curable composition for imprints/volume of storage container)×100(% by volume), where the volume of curable composition for imprints is based on the value at the time of loading.

As is obvious from the Table above, it was found that chipping of the cured pattern was suppressed by using the curable compositions for imprint of the present invention. In other words, by minimizing the moisture content in the curable composition for imprints, the pattern defects were successfully suppressed. It was also found that the effect of the present invention became more prominent, by using the hydroxy group-containing compound as the (C) polar group-containing non-polymerizable compound.

The present disclosure relates to the subject matter contained in Japanese Patent Application No. 228891/2011 filed on Oct. 18, 2011, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

The invention claimed is:

1. A curable composition for imprints comprising (A) a curable compound, (B) a photo-polymerization initiator and (C) a polar group-containing non-polymerizable compound, having a moisture content ratio, relative to the total weight of all components excluding solvent, of less than 0.8% by weight,
wherein the polar group-containing non-polymerizable compound (C) is a hydroxy group-containing polymer.

2. The curable composition for imprints of claim 1, curable by a radical polymerization reaction.

3. The curable composition for imprints of claim 1, containing substantially no solvent.

4. The curable composition for imprints of claim 1, having a viscosity of 5 to 30 mPa·s.

5. A method of manufacturing the curable composition for imprints described in claim 1, comprising mixing the curable compound (A), the photo-polymerization initiator (B) and the polar group-containing non-polymerizable compound (C) under an environment at a temperature of 23° C. and a humidity of 30% or lower.

6. A method of storing a curable composition for imprints, the method comprising enclosing the curable composition for imprints described in claim 1 into a storage container, wherein the ratio of filling of the curable composition in the storage container is 30% by volume or more.

7. The method of storing of claim 6, further comprising using the curable composition enclosed in the storage container for pattern-forming and then, after the pattern-forming, storing any remaining unused curable composition in the storage container at a ratio of filling of 30% by volume or more.

8. The method of storing of claim 6, wherein the curable composition for imprints is stored at 10° C. or lower.

9. The method of storing of claim 8, further comprising bringing the curable composition enclosed in the storage container back to room temperature and using it for pattern-forming and then, after the pattern-forming, storing any remaining unused curable composition in the storage container at a ratio of filling of 30% by volume or more.

10. A pattern-forming method comprising:
applying the curable composition for imprints described in claim 1 onto a base;
pressurizing a mold onto the curable composition for imprints; and
irradiating the light onto the curable composition for imprints.

11. The pattern-forming method of claim 10, wherein the curable composition for imprints is applied onto a base by an ink jet process.

12. A pattern formed by the pattern-forming method described in claim 10.

13. An electronic device comprising the pattern described in claim 12.

14. A method of manufacturing an electronic device, the method comprising a pattern-forming method which includes the steps of:
applying the curable composition for imprints described in claim 1 onto a semiconductor manufacturing substrate composed of silicon, silicon nitride, polysilicon, silicon oxide or amorphous silicon;
pressurizing a mold onto the curable composition for imprints; and
irradiating the light onto the curable composition for imprints.

* * * * *